United States Patent
Guillon

(12) 
(10) Patent No.: US 11,800,247 B2
(45) Date of Patent: Oct. 24, 2023

(54) GLOBAL-SHUTTER ANALOGUE-BINNING PIXEL MATRIX

(71) Applicant: PYXALIS, Moirans (FR)

(72) Inventor: Marie Guillon, Fontanil-Cornillon (FR)

(73) Assignee: PYXALIS, Moirans (FR)

( * ) Notice: Subject to any disclaimer, the term of this patent is extended or adjusted under 35 U.S.C. 154(b) by 0 days.

(21) Appl. No.: 17/719,297

(22) Filed: Apr. 12, 2022

(65) Prior Publication Data

US 2022/0337765 A1    Oct. 20, 2022

(30) Foreign Application Priority Data

Apr. 15, 2021 (FR) .................................. 2103903

(51) Int. Cl.
| | | |
|---|---|---|
| H04N 25/46 | (2023.01) | |
| H04N 25/53 | (2023.01) | |
| H04N 25/75 | (2023.01) | |
| H04N 25/771 | (2023.01) | |
| H04N 25/778 | (2023.01) | |
| H01L 27/146 | (2006.01) | |

(52) U.S. Cl.
CPC ............ *H04N 25/46* (2023.01); *H04N 25/53* (2023.01); *H04N 25/75* (2023.01); *H04N 25/771* (2023.01); *H04N 25/778* (2023.01); *H01L 27/1463* (2013.01)

(58) Field of Classification Search
CPC ........ H04N 25/46; H04N 25/40; H04N 25/41; H04N 25/42; H04N 25/44; H04N 25/441; H04N 25/443; H04N 25/445; H04N 25/447; H04N 25/778; H04N 25/771; H04N 25/53; H04N 25/77; H04N 25/75; H01L 27/1463; H01L 27/14612
See application file for complete search history.

(56) References Cited

U.S. PATENT DOCUMENTS

| | | | |
|---|---|---|---|
| 9,185,319 B2* | 11/2015 | Mayer | H04N 25/771 |
| 9,661,243 B2* | 5/2017 | Yang | H04N 25/46 |
| 10,263,021 B2* | 4/2019 | Gaynor | H04N 25/771 |
| 10,264,242 B2* | 4/2019 | Cazaux | H04N 13/286 |
| 11,240,452 B2* | 2/2022 | Sugizaki | H01L 27/14664 |
| 2014/0218580 A1 | 8/2014 | Mayer et al. | |
| 2014/0263964 A1 | 9/2014 | Yang et al. | |
| 2018/0166477 A1 | 6/2018 | Raynor | |
| 2020/0204753 A1 | 6/2020 | Sugizaki | |

FOREIGN PATENT DOCUMENTS

| | | |
|---|---|---|
| EP | 3 386 186 A1 | 10/2018 |
| EP | 3 882 973 A1 | 9/2021 |
| FR | 3 060 250 A1 | 6/2018 |
| WO | 2020/100577 A1 | 5/2020 |

* cited by examiner

*Primary Examiner* — Marly S Camargo
(74) *Attorney, Agent, or Firm* — BakerHostetler

(57) ABSTRACT

A pixel matrix includes a sub-matrix of four adjacent pixels. Each of the pixels of the sub-matrix comprises: a set of a photoelectric-effect element and a memory point, a detection node, a transfer gate. The binning stage is connected to the set and is common with an adjacent pixel of the sub-matrix. At least one detection node per sub-matrix is common to two adjacent pixels of the sub-matrix. The pixel matrix furthermore comprises at least one readout stage per sub-matrix, connected to the common detection node.

17 Claims, 24 Drawing Sheets

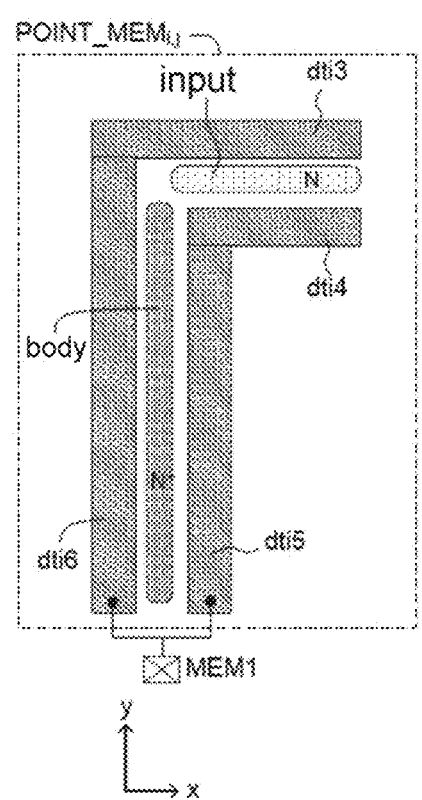

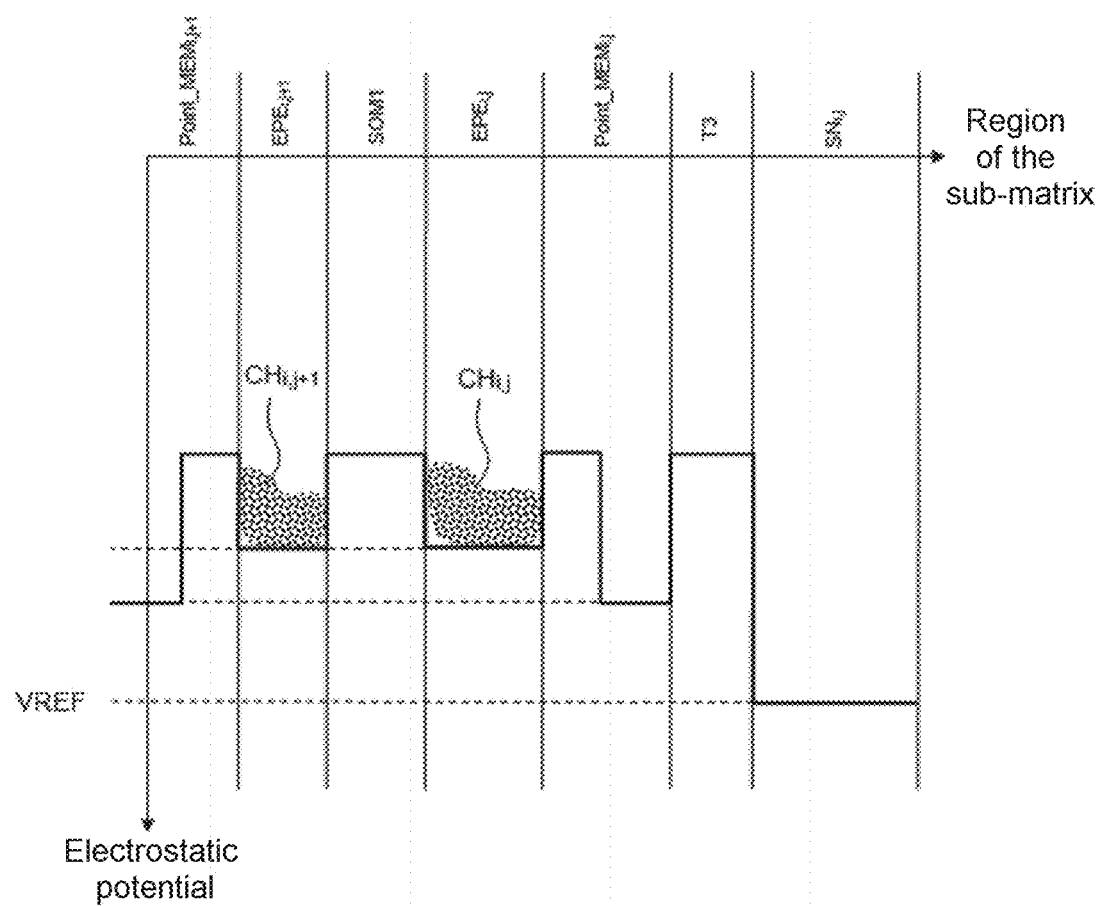

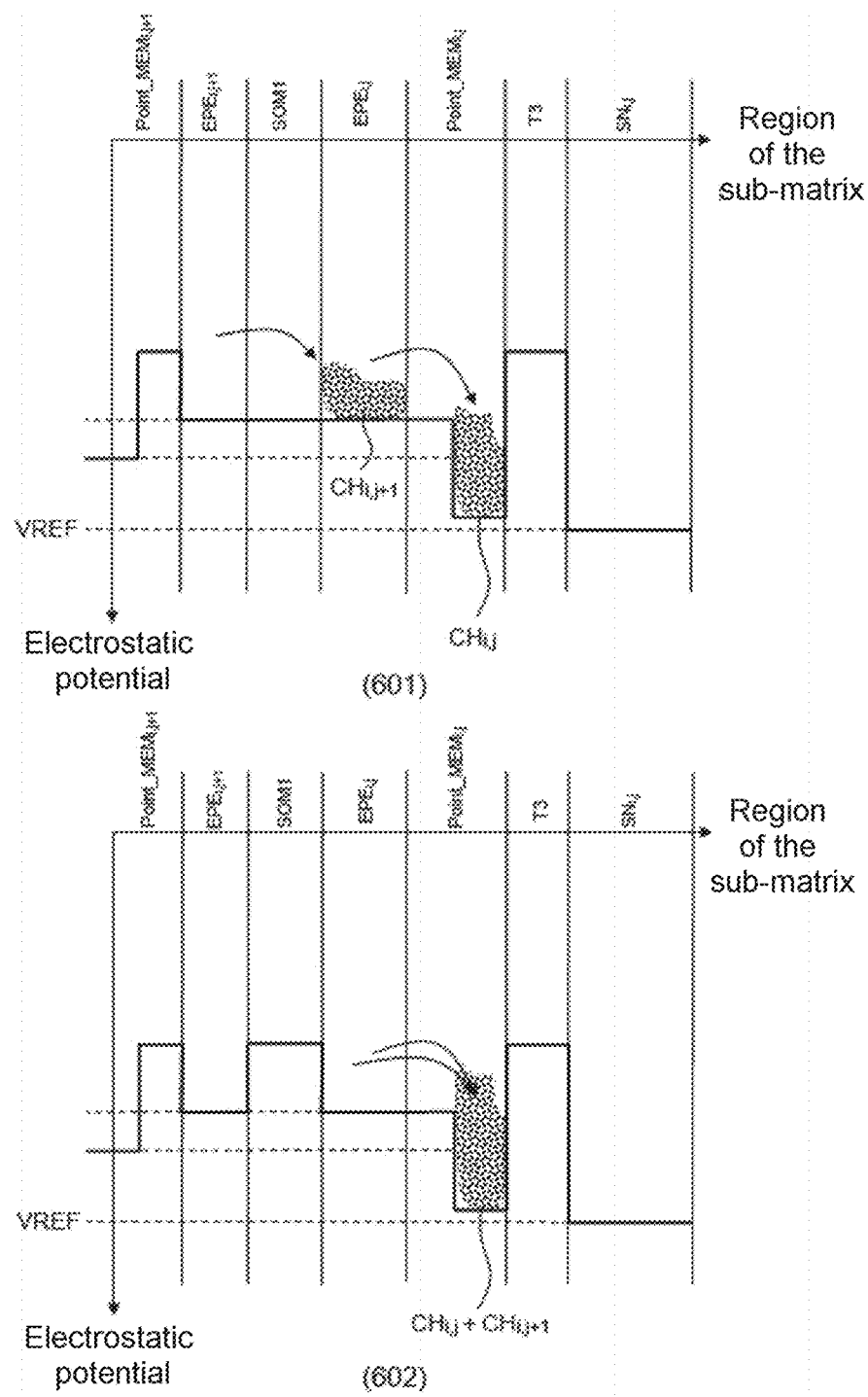

GLOBAL-SHUTTER ANALOGUE-BINNING PIXEL MATRIX

CROSS-REFERENCE TO RELATED APPLICATION

This application claims priority to foreign French patent application No. FR 2103903, filed on Apr. 15, 2021, the disclosure of which is incorporated by reference in its entirety.

FIELD OF THE INVENTION

The invention relates to image sensors based on an active-pixel matrix using CMOS technology.

BACKGROUND

This type of sensor uses photoelectric effects in semiconductor materials to convert received photons into electrical signals for reproducing the captured image. There are two major families of image sensors: sensors based on CCD (charge-coupled device) technology and sensors based on CMOS (complementary metal-oxide semiconductor) technology.

CMOS sensors offer easier integration into integrated circuits on a large scale in combination with a low manufacturing cost in comparison with CCD sensors. Moreover, they make it possible to achieve a higher processing speed with lower energy consumption, which explains why this technology has been adopted for mass-market products such as mobile telephones. There is therefore a major benefit in improving these CMOS technologies by providing them with the advantages of CCD technology so as to achieve or even exceed the performance of CCD technologies to which reference is made, while still maintaining the above-described advantages of CMOS technologies.

Pixel binning consists in binning output signals from a group of adjacent pixels so as to form a larger virtual macro-pixel consisting of n*m pixels, with at least one of the two positive integers n or m being greater than or equal to 2. This technique makes it possible to improve the sensitivity of the image sensor including this feature and thus to improve the signal-to-noise ratio of the image sensor by reproducing the signal from a group of unitary pixels. Pixel binning is commonly used in CCD sensors based on addition of the electric charges generated when these charges are transferred. However, in CMOS image sensors, it is more complex to implement this feature since the output signals from the pixels are conventionally added in the voltage domain and not in the charge domain. In the voltage domain, the binned signal is thus subject to the quadratic addition of noise generated by each pixel, noise associated with their respective readout channel, thereby worsening the signal-to-noise ratio of the binned pixel by a root factor of n*m in comparison with the signal-to-noise ratio of an equivalent pixel of the same size as the non-binned macro-pixel.

The technological and economical context of the field of image sensors justifies the interest in developing solutions for implementing pixel binning in image sensors based on an active-pixel matrix using CMOS technology.

New applications for image sensors are emerging, such as industrial vision, robotics and autonomous cars, and night vision. These applications require superior performance of CMOS-technology image sensors for conditions of low brightness and/or moving targets. These new applications additionally require high dynamic range (HDR) imaging, which expresses the ability of the sensor to integrate a large number of charges while still having a low readout noise in relation to conventional techniques.

Based on the above explanation, it may be deduced that implementing the pixel binning functionality in image sensors based on CMOS technology constitutes a technical challenge since it is necessary to comply with a compromise between the advantages of this functionality, specifically greater sensitivity and a higher signal-to-noise ratio, and its drawbacks linked to greater channel noise if this binning is performed in the voltage domain.

Moreover, CMOS-technology image sensors may be used in two different operating modes. A first operating mode is rolling shutter mode, for which the integration, charge transfer and readout phases are time-offset from one row to another. A second operating mode is global shutter mode, which allows simultaneous capturing of photons in all of the pixels of the matrix. This operating mode is better suited to moving targets. Another constraint thus arises in the same context and consists in adapting the binning solution in the pixel charge domain in CMOS image sensors while remaining compatible with global shutter operation.

There is therefore a need to implement the pixel binning functionality in the charge domain in CMOS image sensors while still retaining the advantages provided by CMOS technologies using pinned photodiodes, and to do so while remaining compatible with global shutter operation. This is needed to achieve the signal-to-noise ratio performance for a pixel of a size equivalent to the binned macro-pixel.

American patent application US 2014/0263964 A1 describes a CMOS image sensor containing a pixel matrix able to perform pixel binning by pooling the detection node of a set of n*n pixels. The drawback of this solution is that pooling the detection node for a high number of pixels increases the value of the capacitance on this node with respect to the overall mass obtained via the accumulation of the stray capacitances intrinsic to the various MOS transistors forming the set of pixels. This has the effect of reducing the conversion factor (commonly denoted CVF, and representing the conversion gain of the electrons in terms of voltage) of the image sensor, but consequently increasing the channel noise returned at input by this conversion factor. This solution thus exhibits the drawback of worsening the performance of the image sensor for conditions of low brightness in terms of signal-to-noise ratio.

American patent application US 2014/00218580 A1 describes a CMOS image sensor containing a pixel matrix capable of performing pixel binning using an asymmetric gate for the temporary storage of charges, arranged between the photodiode of the first pixel and the photodiode of the second pixel. However, the solution proposed by US 2014/00218580 A1 is incompatible with a global shutter operating mode and is limited to rolling shutter operation.

To overcome the limits of the existing solutions with regard to implementing the pixel binning functionality in order to improve the sensitivity of the CMOS image sensor, the invention proposes an improved pixel matrix structure. The proposed solution consists of a pixel matrix formed using CMOS technology integrated into an image sensor and comprising at least one 2*2 pixel sub-matrix having means for binning electric charges, allowing it to perform pixel binning in the charge domain.

This solution differs from previously developed pixel binning solutions through a superior conversion capability in combination with a low channel noise level, but also a more compact physical implementation. This improves the performance of the image sensor under conditions of low brightness, requiring high sensitivity and a high signal-to-noise ratio.

The invention also has the advantage of making it possible to associate the pixel binning functionality with global shutter operation, thus offering superior performance in the case of a moving target.

In addition, the invention remains compatible with operation without binning of the charges of the macro-pixels of the pixel matrix by adapting the control signals that control the readout phase of reading out the output signals from the set of pixels of the matrix. This offers a person skilled in the art flexibility in terms of using this functionality in the image capture conditions and environment.

SUMMARY OF THE INVENTION

One subject of the invention is a pixel matrix of N rows and M columns produced in a semiconductor substrate, the matrix comprising at least one sub-matrix of four adjacent pixels.

Each of the pixels of the sub-matrix comprises: a set of a photoelectric-effect element for generating electric charges in response to incident electromagnetic radiation and a memory point connected to the output of the photoelectric-effect element for storing the generated electric charges, a detection node, a transfer gate, connected between the output of the memory point and the detection node, and a binning stage. The binning stage is connected to said set and is common with an adjacent pixel belonging to the same row of the sub-matrix. At least one detection node per sub-matrix is common to two adjacent pixels belonging to the same column of the sub-matrix. The pixel matrix furthermore comprises at least one readout stage per sub-matrix, connected to the common detection node.

According to one particular aspect of the invention, each of the photoelectric-effect elements is a pinned photodiode.

According to one particular aspect of the invention, each of the binning stages is formed by a pair of deep isolation trenches arranged in parallel.

According to one particular aspect of the invention, each of the memory points is formed by an arrangement of deep isolation trenches. The deep isolation trenches form two electric charge traps: the first trap constitutes the input of the memory point and the second trap, doped with charge carriers at a dose greater than that of the first trap, constitutes the body of the memory point.

According to one particular aspect of the invention, each of the memory points is formed by an arrangement of two pairs of deep isolation trenches. The deep isolation trenches form two electric charge traps: the first trap constitutes the input of the memory point and it is formed by the first pair of trenches arranged in parallel and separated by a first distance; the second trap constitutes the body of the memory point and it is formed by the second pair of trenches arranged in parallel and separated by a second distance. The first distance is smaller than the second distance.

According to one particular aspect of the invention, the binning stage is connected between the output of the photoelectric-effect element and the output of the photoelectric-effect element of the adjacent pixel of the sub-matrix belonging to the same row. In addition, the pixels of the sub-matrix belonging to the same column have a common detection node and a common readout stage.

According to one particular aspect of the invention, the control means in the previous embodiment are configured so as to apply, for each pixel of one and the same column: a high potential to the deep isolation trenches forming the memory point for receiving the electric charges generated by the photoelectric-effect element; a low potential to the deep isolation trenches forming the memory point belonging to the adjacent pixel of the sub-matrix belonging to the same row and a low potential to the deep isolation trenches forming the binning stage.

According to one particular aspect of the invention, the control means in the previous embodiment are configured so as to apply, simultaneously for each pixel of one and the same column: a high potential to the deep isolation trenches forming the memory point; a low potential to the deep isolation trenches forming the memory point belonging to the adjacent pixel of the sub-matrix belonging to the same row and a high potential to the deep isolation trenches forming the binning stage, in order to bin the electric charges generated by the pixels belonging to one and the same row of the sub-matrix.

According to one particular aspect of the invention, the binning stage of a pixel of the sub-matrix is connected between the output of the memory point and the output of the memory point of the pixel of the sub-matrix belonging to the same row. In addition, the pixels of the sub-matrix belonging to the same column have a common detection node and a common readout stage.

According to one particular aspect of the invention, the binning stage of a pixel of the sub-matrix is connected between the output of the memory point and the output of the memory point of the pixel of the sub-matrix belonging to the same column. A first pair of pixels of the sub-matrix belonging to the same row share a common detection node and a common readout stage.

A second pair of pixels of a sub-matrix belonging to the same column are shared with another adjacent sub-matrix. The first pair of pixels of the adjacent sub-matrix is arranged on a different row from the first pair of pixels of the sub-matrix.

According to one particular aspect of the invention, the control means are configured so as to apply, for each pixel of the sub-matrix: a high potential to the deep isolation trenches forming the memory point for receiving the electric charges generated by the photoelectric-effect elements and a low potential to the deep isolation trenches forming the binning stages.

According to one particular aspect of the invention, the control means are configured so as to simultaneously apply, to a pair of adjacent pixels in a first direction: a high potential to the deep isolation trenches forming the memory point and a low potential to the deep isolation trenches forming the memory point belonging to the adjacent pixel of the sub-matrix in a second direction different from the first direction and a high potential to the deep isolation trenches forming the binning stages. This makes it possible to bin the electric charges generated by the adjacent pixels in the second direction.

According to one particular aspect of the invention, the control means are configured so as to apply, to the pair of adjacent pixels in a first direction, for example to two pixels of the same column, a high potential to the transfer gates in order to bin the electric charges generated in the common readout stage.

According to one particular aspect of the invention, each readout stage comprises a reset transistor connected to the detection node in order to reset the detection node to a chosen supply voltage; an amplification transistor connected in a common drain configuration, whose gate is connected to the detection node, and a selection transistor connected to the output of the amplifier transistor in order to sample the output signal.

One subject of the invention is notably an image sensor comprising: a pixel matrix according to the various previous embodiments of the invention; a control signal generation circuit for generating control signals for the pixels; a sampling circuit arranged at the base of each column of the pixel matrix, connected to the output of the readout stage of each pixel of the corresponding column, and a power supply circuit for supplying power to each column of the pixel matrix.

According to one particular aspect of the invention, the sampling circuit is a correlated double sampling circuit.

According to one particular aspect of the invention, the sensor is designed for global shutter operation.

BRIEF DESCRIPTION OF THE DRAWINGS

Other features and advantages of the present invention will become more clearly apparent upon reading the following description with reference to the following appended drawings.

FIG. 2b shows a plan view of the binning stage according to the embodiment of FIG. 2a.

FIG. 3a shows a plan view of a first embodiment of a memory point produced with face-to-face capacitive deep isolation trenches.

FIG. 3c shows graphs of electrostatic potentials in the traps of the memory point illustrated in FIG. 3a.

FIG. 6c shows a graph of electrostatic potentials illustrating the first step of the electric charge binning in a sub-matrix according to the first embodiment illustrated in FIG. 1.

FIG. 6g shows a graph of electrostatic potentials illustrating the third step of the electric charge binning in a sub-matrix according to the first embodiment illustrated in FIG. 1.

DETAILED DESCRIPTION

Figure 1:
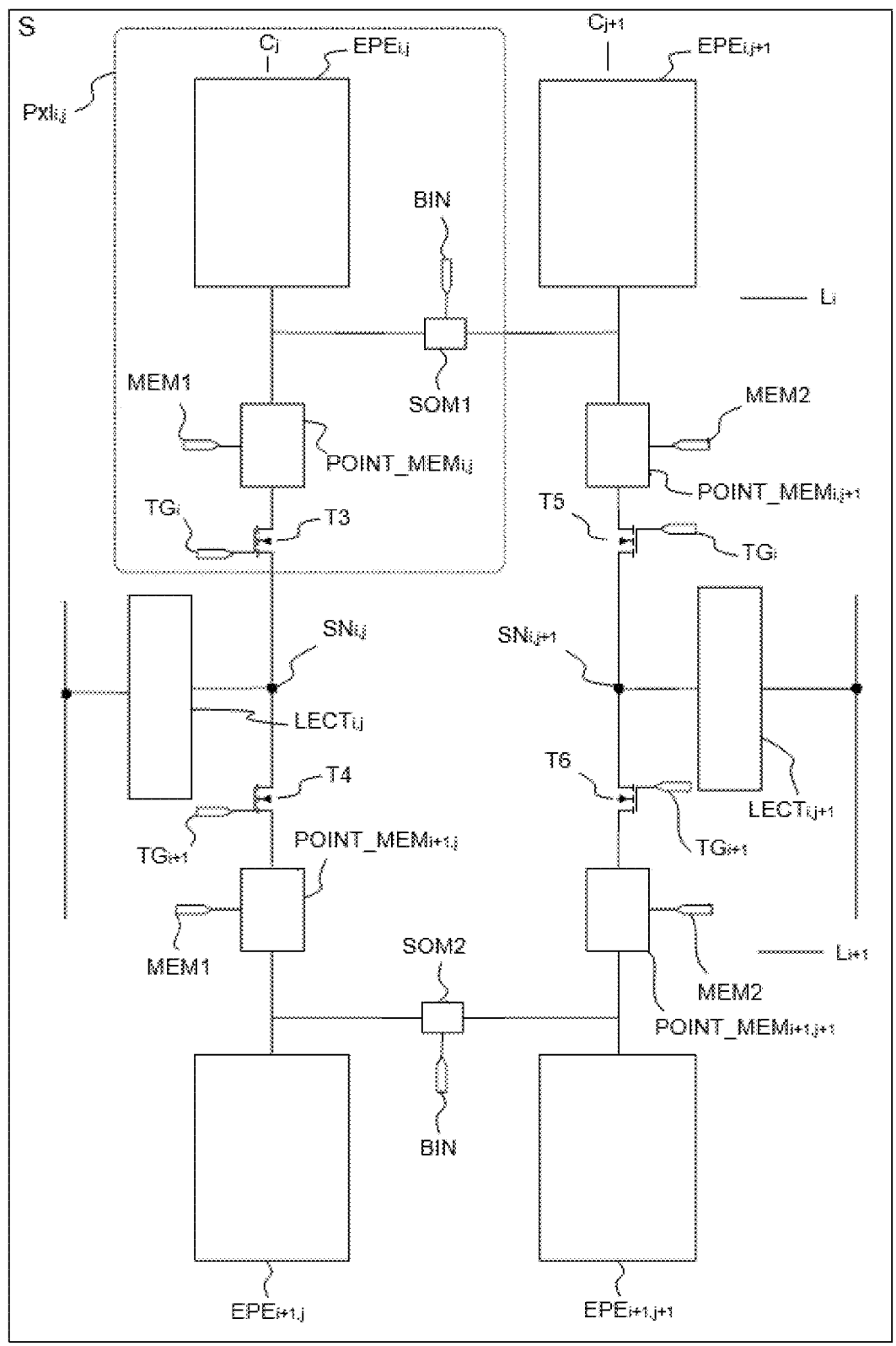
FIG. 1 shows a functional diagram of a pixel sub-matrix according to a first embodiment of the invention.

FIG. 1 is a functional diagram showing the architecture of a set of four pixels belonging to a pixel matrix consisting of N rows $L_i$ of rank i, where i=1 to N, and M columns $C_j$ of rank j, where j=1 to M, formed on a semiconductor substrate. The four pixels are respectively denoted $Pxl_{i,j}$, $Pxl_{(i+1),j}$, $Pxl_{i,(j+1)}$ and $Pxl_{(i+1),(j+1)}$ in accordance with their coordinates in the pixel matrix.

The four pixels $Pxl_{i,j}$, $Pxl_{i+1,j}$, $Pxl_{i,j+1}$ and $Pxl_{i+1,j+1}$ are identical and form a symmetrical sub-matrix, denoted S, of dimension 2*2, assimilated to a virtual macro-per.

The four pixels of the sub-matrix S each have electric charge transfer means for performing a first operation of binning the electric charges generated by the two pixels ($Pxl_{i,j}$ and $Pxl_{i,j+1}$ for example) of the sub-matrix S belonging to the same row and a second operation of binning the electric charges generated by the two pixels ($Pxl_{i,j}$ and $Pxl_{i+1,j}$ for example) of the sub-matrix belonging to the same column. The symmetry of the structure of the sub-matrix S offers the possibility of performing the binning in a direction from one unitary pixel to another in both directions.

To illustrate the architecture of the pixels $Pxl_{i,j}$, $Pxl_{i+1,j}$, $Pxl_{i,j+1}$ and $Pxl_{i+1,j+1}$ that form the sub-matrix S, a description will be given below of the composition of the pixel $Pxl_{i,j}$ by way of example.

The pixel $Pxl_{i,j}$ comprises a photoelectric-effect element $EPE_{i,j}$ for generating and storing electric charges in response to incident electromagnetic radiation, a memory point $POINT\_MEM_{i,j}$ connected to the output of the photoelectric-effect element $EPE_{i,j}$ and controlled by the signal MEM1 for storing the generated electric charges; a transfer gate T3 controlled by the signal $TG_i$, which connects a common detection node $SN_{i,j}$ with the adjacent pixel $Pxl_{i+1,j}$ belonging to the same column of the sub-matrix S; and a binning stage SOM1 controlled by the signal BIN common with the adjacent pixel $Pxl_{i,j+1}$ belonging to the same row of the sub-matrix S.

In addition, a readout stage $LECT_{i,j}$ is connected to the detection node $SN_{i,j}$, which provides for the transition from the charge domain to the voltage domain. The readout stage $LECT_{i,j}$ formats the signal corresponding to the charges collected in the associated pixel. The readout stage $LECT_{i,j}$ is shared with the pixel $Pxl_{i+1,j}$ belonging to the same column of the sub-matrix S.

As mentioned above, the photoelectric-effect element $EPE_{i,j}$ is used to generate electric charges in response to incident electromagnetic radiation. One exemplary embodiment of this element is a pinned photodiode. The photodiode is generally constructed by the joining of a P+-doped thin layer with an N-doped diffusion region in a P-doped semiconductor substrate. Upon exposure to electromagnetic radiation, the incident photons will interact with the semiconductor substrate so as to generate electron-hole pairs that will be collected in the space charge region of the junction and more precisely in the cathode for the case of electrons. Reference is made here to the charge integration phase.

The binning stage SOM1 behaves like a switch controlled by the signal BIN and connecting the outputs of the photoelectric-effect element $EPE_{i,j}$ to the photoelectric-effect element $EPE_{i,j+1}$ belonging to the row $L_i$ of the sub-matrix S. Applying a positive pulse to the signal BIN leads to activation of the binning stage, thus establishing an electrical connection between the outputs of the two adjacent photoelectric-effect elements $EPE_{i,j}$ and $EPE_{i,j+1}$. Establishing this connection allows the electric charges generated by the photoelectric-effect element $EPE_{i,j+1}$ following an integration phase to migrate to the adjacent photoelectric-effect element $EPE_{i,j+1}$, and vice versa.

A second binning stage SOM2, identical to the first binning stage SOM1 and controlled by the same signal BIN, is connected between the outputs of the two photoelectric-effect elements $EPE_{i+1,j}$ and $EPE_{i+1,j+1}$, both belonging to the following row $L_{i+1}$ of the sub-matrix S for providing the same function of binning charges between the photoelectric-effect elements $EPE_{i+1,j}$ and $EPE_{i+1,j+1}$ and thus between the two adjacent pixels of the row $Pxl_{i+1,j}$ and $Pxl_{i+1,j+1}$.

The memory point POINT_MEMi,j, controlled by the signal MEM1, is designed to store the electric charges collected in the substrate of the photoelectric-effect element EPEi,j following the application of a pulse to the signal MEM1. Each of the pixels of the sub-matrix S contains a memory point identical to the memory point POINT_MEMi,j connected to the output of the corresponding photoelectric-effect element. Implementing the memory points POINT_MEMi,j, POINT_MEMi,j+1, POINT_MEMi+1,j, POINT_MEMi+1,j+1 ensures global shutter operation of the image sensor, making it possible to perform the electric charge integration phase for all of the pixels simul- taneously and to store said electric charges in the memory points so as then to trigger a sequential row-by-row readout of the stored charges.

The memory points $POINT\_MEM_{i,j}$ and $POINT\_MEM_{i+1,j}$ belonging to the pixels of the column of rank j $C_j$, are controlled by the same signal MEM1, while the memory points $POINT\_MEM_{i,j+1}$ and $POINT\_MEM_{i+1,j+1}$ belonging to the pixels of the column of rank j+1 $C_j+1$ are controlled by the same signal MEM2.

The transfer gate T3 is connected between the output of the memory point $POINT\_MEM_{i,j}$ and the detection node $SN_{i,j}$. This gate controls a transfer of electric charges to the detection node $SN_{i,j}$. Specifically, when the signal external to the pixel $TG_i$, connected to the transfer gate is at a high level, the charges that are created may diffuse to the detection node $SN_{i,j}$. The gate generally corresponds to a polysilicon gate connected to the detection node which is an N-type floating diffusion region. Reference is made here to the charge transfer phase of transferring charges to the detection node and thus to the input of the readout stage $LECT_{ij}$.

By symmetry, the transfer gates T5, T6 and T4 belong respectively to the pixels $Pxl_{i,j+1}$, $Pxl_{i+1,j+1}$ and $Pxl_{i+1,j}$. The control signal $TG_i$, is addressed in rows to the transfer gates T3 and T5 belonging to the row of rank i $L_i$. The control signal $TG_{i+1}$ is shared between the transfer gates T4 and T6 belonging to the row of rank i+1 $L_{i+1}$. Since the detection node $SN_{i,j}$ is common between the pixels $Pxl_{i,j}$ and $Pxl_{i+1,j}$, simultaneously activating the two transfer gates T4 and T3 makes it possible to accumulate the electric charges coming from these two pixels in the common detection node $SN_{i,j}$ so as then to be read via the common readout stage $LECT_{i,j}$. This then makes it possible to bin the charges generated by the pixels belonging to the column of rank j $C_j$.

By symmetry, the same vertical binning functionality may be achieved for the pixels $Pxl_{i,j+1}$ and $Pxl_{i+1,j+1}$ belonging to the column of rank j+1 $C_{j+1}$ via the simultaneous activation of the transfer gates T5 and T6.

The main role of the readout stages $LECT_{i,j}$ and $LECT_{i,j+1}$ is that of matching the converted signals to the levels of the detection nodes $SN_{i,j}$ and $SN_{i,j+1}$ so as to be propagated in the associated columns. They thus provide the reset and sequential addressing functionalities during the readout of the various pixels of the matrix.

Figure 2A:
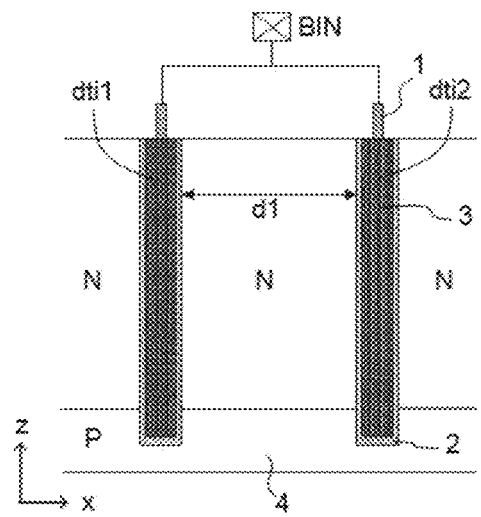
FIG. 2a shows a sectional view of one embodiment of a binning stage produced with face-to-face capacitive deep isolation trenches.
Figure 2B:
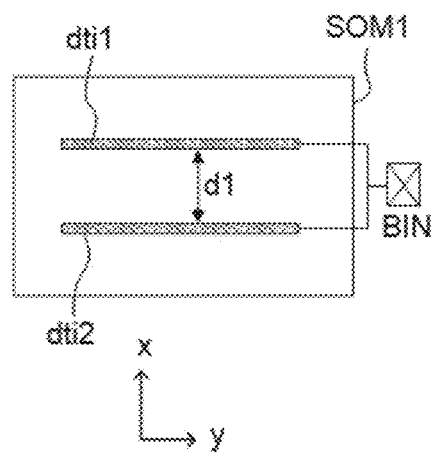

FIGS. 2a and 2b describe one example of a physical implementation of the binning stage SOM1 or SOM2 in section along the axis x and in a plan view.

FIG. 2b shows a plan view of the binning stage SOM1 or SOM2 formed on a semiconductor substrate using a deep trench isolation (commonly referred to by the acronym DTI) arrangement. Deep isolation trenches are components that are compatible with microelectronic manufacturing processes used to isolate a region of the semiconductor substrate so as to limit the leakage current in an integrated circuit for example. There is a variant of this type of component called capacitive deep isolation trenches (also called CDTI for capacitive deep trench isolation). This variant is used to illustrate the invention without a loss of generality.

To effectively understand the implementation of a binning stage using capacitive deep isolation trenches CDTI, FIG. 2a shows a sectional view, along the axis x of FIG. 2b, of a pair of capacitive deep isolation trenches CDTI, respectively denoted dti1 and dti2. The structure of a CDTI trench is manufactured by etching the semiconductor substrate 4 so as to create a deep trench a few micrometres deep (between 3 µm and 6 µm) and with a width of a few hundred nanometres (between 100 nm and 300 nm). An insulating layer 2, for example an oxide, is created on the inner wall of the trench through an oxidation process, and then the trench is filled with polysilicon 3. A metal contact 1 is deposited on the surface of the manufactured CDTI trench so as to apply a potential to the obtained structure.

By placing a pair of CDTI trenches face-to-face as shown in FIGS. 2a and 2b for dti1 and dti2, by applying the same electrical potential to the metal contacts of each of the trenches and with N-type doping of the space between the two CDTI trenches, an electrostatic potential well is obtained between the two trenches along the axis x, which well is able to accumulate electric charges, specifically electrons in the case presented with N-type doping. The depth of the potential well obtained by the face-to-face arrangement of two CDTI trenches depends on two factors: the distance d1 between the two trenches and the level of doping in the confined space between the pair of trenches dti1 and dti2. The increase in the distance d1 leads to the increase in the depth of the potential well that is created. The greater the N-type doping, the more the depth of the potential well increases.

Advantageously, using CDTI trenches makes it possible to transfer all of the charges of the two adjacent photodiodes to a single memory node. This is not possible when using a transistor for binning. Using CDTI trenches makes it possible to eliminate thermal noise (kTC), this not being feasible when using a transistor to control the flow of charges.

Figure 2C:
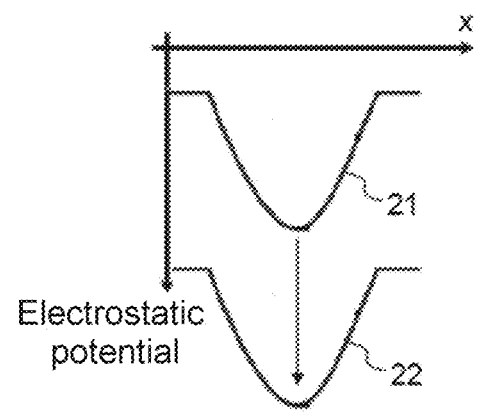
FIG. 2c shows graphs of electrostatic potentials in the binning stage illustrated in FIG. 2a in a horizontal section.

FIG. 2c shows the electrostatic potential well 21 in a section along the axis x between the two CDTI trenches (dti1 and dti2), which form a binning stage following the application of a low potential to these CDTI trenches via the signal BIN. FIG. 2c also shows the electrostatic potential well 21 in a section along the axis x between the two CDTI trenches (dti1 and dti2), which form a binning stage following the application of a high potential to these CDTI trenches. In accordance with the convention usually chosen, increasing potentials are shown, on the electrostatic potential axis, going from top to bottom. A potential well for electrons thus corresponds to a parabolic function of the electrostatic potential that points downward and whose maximum is the bottom of the potential well according to the adopted convention. The higher the maximum potential, the deeper the potential well for electrons. Applying a positive pulse to the CDTI trenches dti1 and dti2 via the signal BIN shifts the level of the electrostatic potential well 21 to the position of the electrostatic potential well 22. This corresponds to moving a potential barrier, thus allowing the electric charges to migrate via the binning stage formed by the structure described above, if the electrostatic well of the diode is positioned suitably.

Implementing this CDTI trench structure dti1 and dti12 between two photodiodes corresponding to photoelectric-effect elements makes it possible to control the migration of charges from one pixel to another, this constituting a step in the process of binning charges in a sub-matrix S of dimension 2*2.

FIG. 3a shows a plan view of one example of a physical implementation of a memory point used in the pixels of the sub-matrix S according to the invention.

A memory point POINT_MEM$_{i,j}$ as described in FIG. 3a consists of an arrangement of two pairs of CDTI trenches placed face-to-face, that is to say (dti3, dti4) and (dti5, dti6). The deep isolation trenches form two electric charge traps in two perpendicular directions. The first trap constitutes the input of the memory point doped with N-type charge carriers and the second trap, doped with a higher dose of charge carriers so as to have N+-type doping, constitutes the body of the memory point. The set of CDTI trenches that form the memory point, specifically dti1, dti2, dti3 and dti4, are controlled by the same control signal MEM1 (or MEM2). The difference in doping between the input of the memory point and the body of the memory point creates an electrostatic potential difference between the traps created by the two regions, and this results in the electrostatic potential graph 31 shown in FIG. 3c.

As an alternative, it is possible to implement the input of the memory point in a direction that is different but not perpendicular to that of the body of the memory point, while still keeping the difference in doping between the two regions.

Figure 3B:
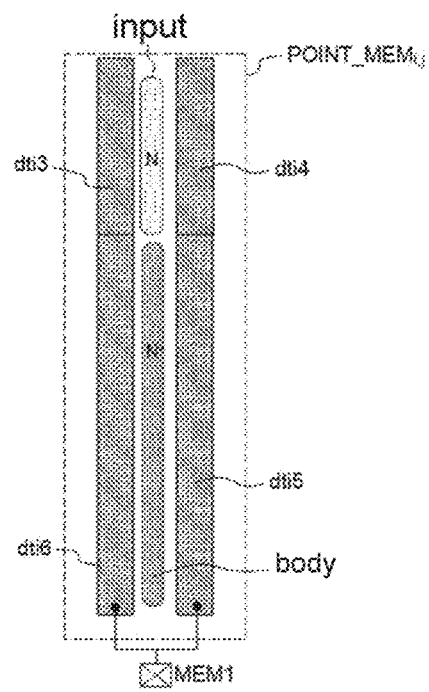
FIG. 3b shows a plan view of a second embodiment of a memory point produced with face-to-face capacitive deep isolation trenches.
Figure 3C:
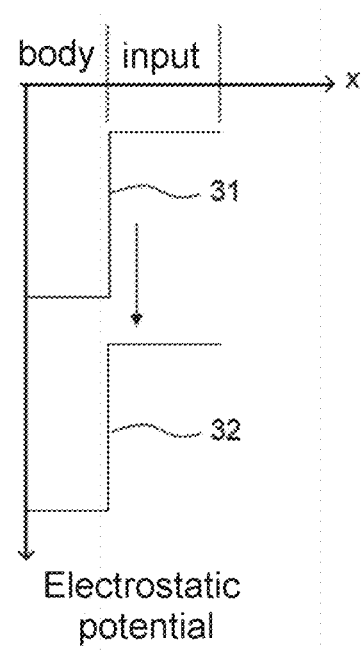

As an alternative, it is possible to implement the input of the memory point in the same direction as that of the body of the memory point as illustrated in FIG. 3b, while still keeping the difference in doping dose between the two regions.

As an alternative, it is possible to form the memory point POINT_MEM$_{i,j}$ consisting of an input and of a body based on a difference in the distance between the trenches that form each region (input and body), and not a difference in doping of the substrate. Specifically, let d2 be the distance between the trenches dti3 and dti4 that form the input of the memory point, and let d3 be the distance between the trenches dti5 and dti6 that form the body of the memory point. It will be recalled that, for a pair of trenches arranged face-to-face, the increase in the distance between the two trenches leads to the increase in the depth of the potential well that is created between the two trenches. Thus, with an equivalent doping dose, if the distance d3 separating the trenches that form the input of the memory point is less than the distance d4 between the trenches that form the body of the memory point, this gives the same electrostatic potential graph as described in FIG. 3c. A memory point is thus formed based on the geometric variations in the structure, and not based on the variations in the doping dose.

In a manner similar to the principle explained for the binning stages based on CDTI trenches, applying a high potential to the trenches that constitute the memory point shifts the potential barrier 31 to the position of the barrier illustrated by the graph 32, thus allowing electric charges to migrate through the trap at the input of the memory point, which charges will thus be stored in the trap at the region of the body, thus forming the memory function.

Figure 4:
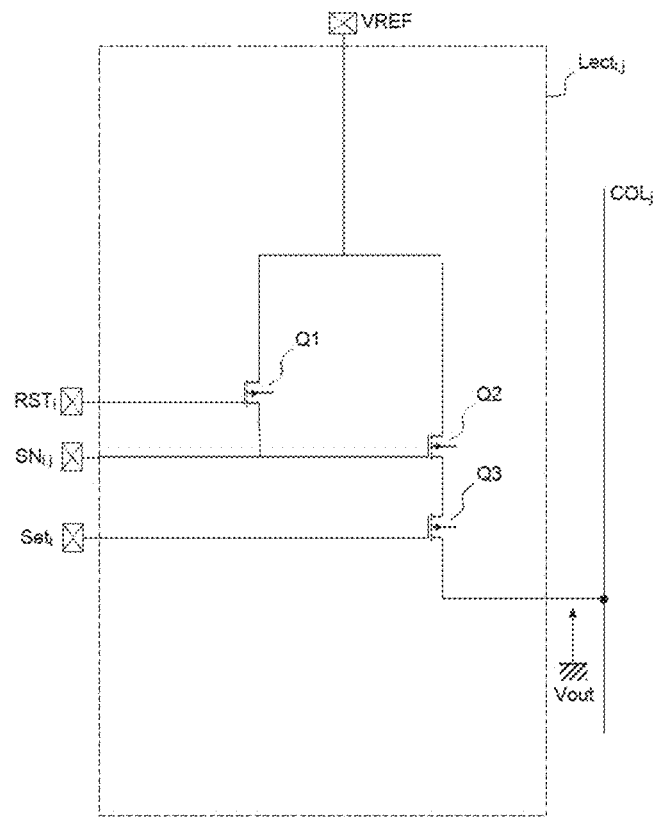
FIG. 4 shows one example of a circuit diagram of a readout stage.

FIG. 4 illustrates a circuit diagram of one exemplary implementation of the readout stage LECT$_{i,j}$ used in the sub-matrix S according to one of the embodiments of the invention.

The readout stage LECT$_{i,j}$ receives two input signals RST$_i$ and SEL$_i$ common with ail of the other readout stages of the pixel matrix belonging to the same row of rank i L$_i$. The readout stage LECT$_{i,j}$ is also supplied with a reference voltage VREF. The readout stage LECT$_{i,j}$ converts the charges collected by the detection node SN$_{i,j}$ into an output voltage Vout that is propagated in the conductive row COLS.

The readout stage LECT$_{i,j}$ comprises a reset transistor Q1 connected between the detection node SN$_{i,j}$ and the external reference voltage VREF for resetting the detection node and making it possible to perform correlated double sampling on the global scale of the image sensor.

The readout stage LECT$_{i,j}$ also comprises an amplification transistor Q2 connected in a common drain configuration for matching the output signal to the conductive row of the associated column.

The readout stage LECT$_{i,j}$ also comprises a selection transistor Q3 connected to the output of the amplification transistor Q2 for sampling the output signal from the amplification transistor Q2. The selection switch T5 is controlled by a row selection signal denoted $SEL_i$. When the row to which the pixel belongs is chosen to be read out, the transistor Q3 is in the on state, thus allowing the signal Vout to propagate to the output of the readout stage in the column via the conductive row $COL_j$.

Figure 5:
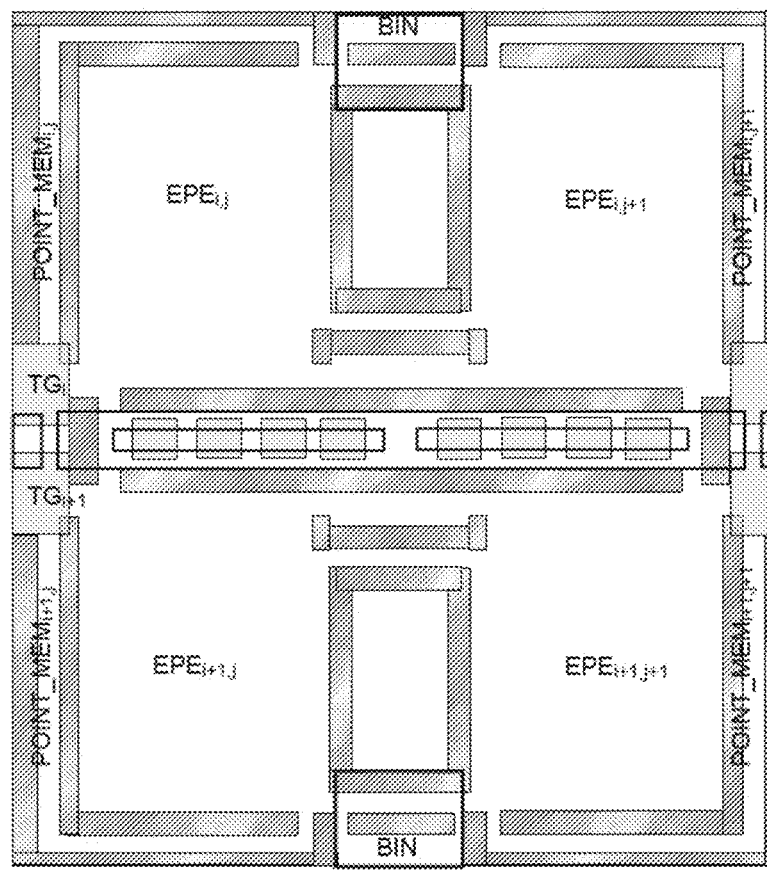
FIG. 5 shows a plan view of one example of a physical implementation of the pixel sub-matrix according to a first embodiment of the invention.

FIG. 5 illustrates a plan view of one example of a physical implementation (layout) of the sub-matrix S according to the first embodiment described in FIG. 1. A person skilled in the art will be able to distinguish between the various components of the sub-matrix S described in the description of FIG. 1 in this specific view, which reflects the mask used in various steps of a microelectronic manufacturing process in a semiconductor substrate.

Figure 6A:
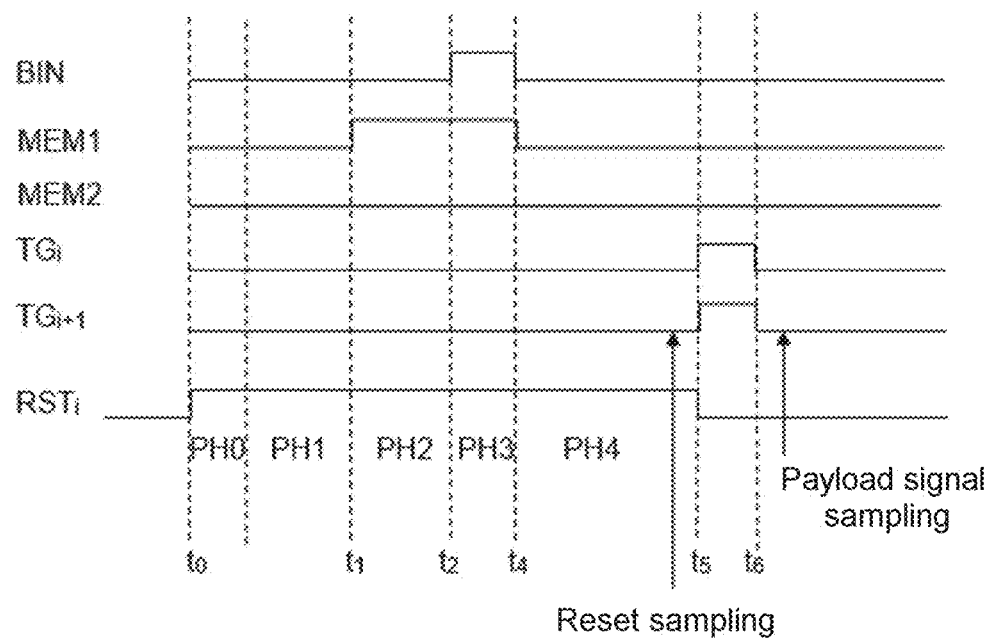
FIG. 6a shows a timing diagram of the operation of the sub-matrix illustrated in FIG. 1 during electric charge binning.

FIG. 6a shows a timing diagram of the operation of the sub-matrix illustrated in FIG. 1 with electric charge binning.

FIGS. 6b to 6i illustrate the various steps of operation with electric charge binning in a sub-matrix according to the first embodiment illustrated in FIG. 1. For each step, the path of the electric charges generated by the pixels of the sub-matrix S is charted on the scale of the circuit diagram of the sub-matrix S, but also on the scale of the potential graphs of the potentials in the semiconductor substrate of the various components of the pixel sub-matrix S. This approach allows a better understanding of the physical phenomena that govern the operation with binning in the structure described according to the invention.

In FIG. 6a, it is possible to discern the following steps:
1. Step PH0: Resetting of the readout stage.
2. Step PH1: Electric charge integration by the photodiodes.
3. Step PH2: Storage of the electric charges of the pixels $Pxl_{i,j}$ and $Pxl_{i+1,j}$ of the receiver column.
4. Step PH3: Horizontal electric charge binning.
5. Step PH4: Vertical electric charge binning and readout.

This process will be described step by step.

At t0, the rising edge on the external control signal $RST_i$ triggers the reset step PH0, which forces the value of the detection node SN of each pixel to a predetermined voltage. This step is not involved directly in the functionality of the electric charge binning of the pixels, but it is clear to a person skilled in the art that the reset is essential for operation compatible with correlated double sampling.

Next, the charge integration phase PH1 is triggered, and all of the control signals are set to a law potential (corresponding to a logic level 0) for a duration sufficient to accumulate the electric charges in the photodiodes following exposure to incident light.

Figure 6B:
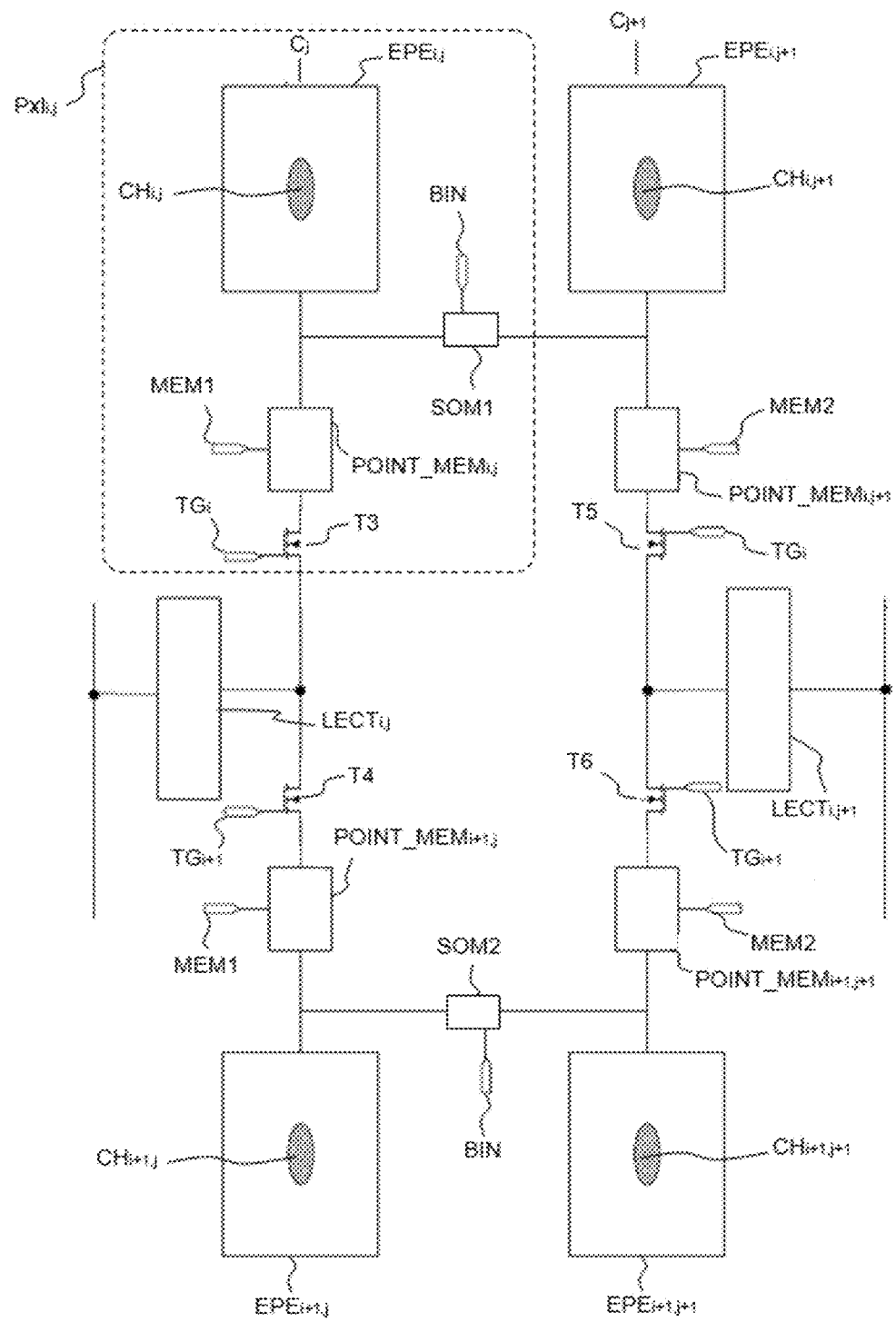
FIG. 6b shows the first step of the electric charge binning in a sub-matrix according to the first embodiment illustrated in FIG. 1.

FIG. 6b illustrates the generation of electric charge packets (dashed ellipses $CH_{i,j}$, $CH_{i,j+1}$, $CH_{i+1,j}$, $CH_{i+1,j+1}$) by the various photoelectric-effect elements that belong to the pixels constituting the sub-matrix S.

FIG. 6c shows the state of the electrostatic potential graph during the integration step PH1 of integrating, into the volume of the semiconductor substrate, the various components of the sub-matrices S as presented by FIG. 6b. Applying a low potential (with MEM1=0 and MEM2=0) to the CDTI trenches that constitute the memory points $POINT\_MEM_{i,j}$ and $POINT\_MEM_{i,j+1}$ leads to the establishment of a potential barrier at the input of the memory points. Applying a low potential (with BIN=0) to the CDTI trenches that constitute the binning stage SOM1 also establishes a potential barrier that makes the binning stage block the propagation of the charges. This thus gives a potential well in the volume of the photoelectric-effect elements $EPE_{i,j}$ and $EPE_{i,j+1}$, as shown in FIG. 6c. It is dearly seen that the generated charges $CH_{i,j}$, and $CH_{i,j+1}$ are trapped in the potential wells at the photodiodes. By symmetry, during the integration step, the same electrostatic potential graph is obtained for the two pixels $Pxl_{i+1,j}$ and $Pxl_{i+1,j+1}$.

After a certain period, the integration phase PH1 ends and the rising edge on the signal MEM1 triggers the step of storing the electric charges of the pixels $Pxl_{i,j}$ and $Pxl_{i+1,j}$ of the receiver column $C_j$, denoted PH2. At the same time, the control signal MEM2 is kept at a low logic level, thus maintaining the potential barrier between the photodiodes of the pixels $Pxl_{i,j+1}$ and $Pxl_{i+1,j+1}$ of the receiver column Cr and the inputs of the memory points belonging to the same pixels.

Figure 6D:
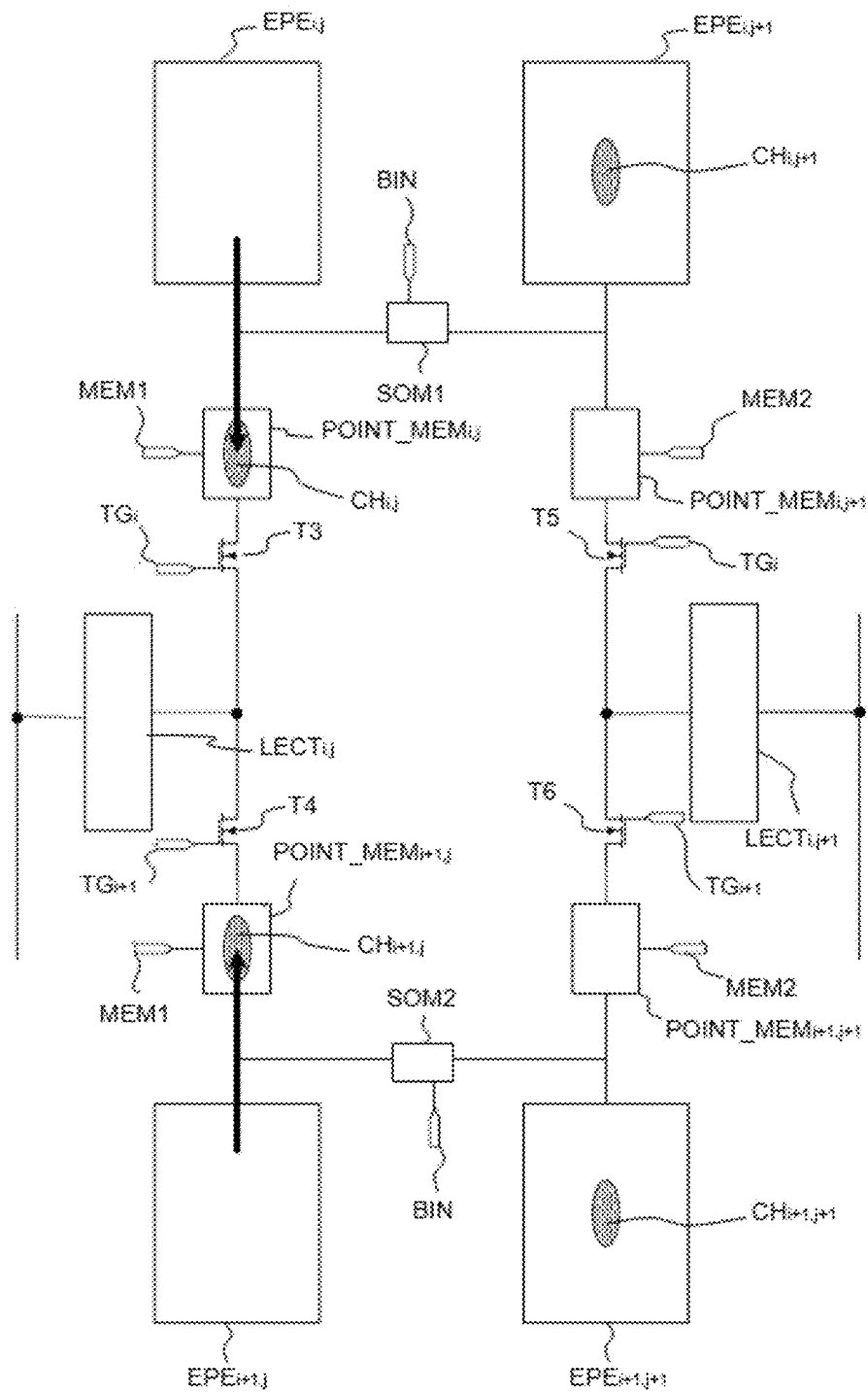
FIG. 6d shows the second step of the electric charge binning in a sub-matrix according to the first embodiment illustrated in FIG. 1.
Figure 6E:
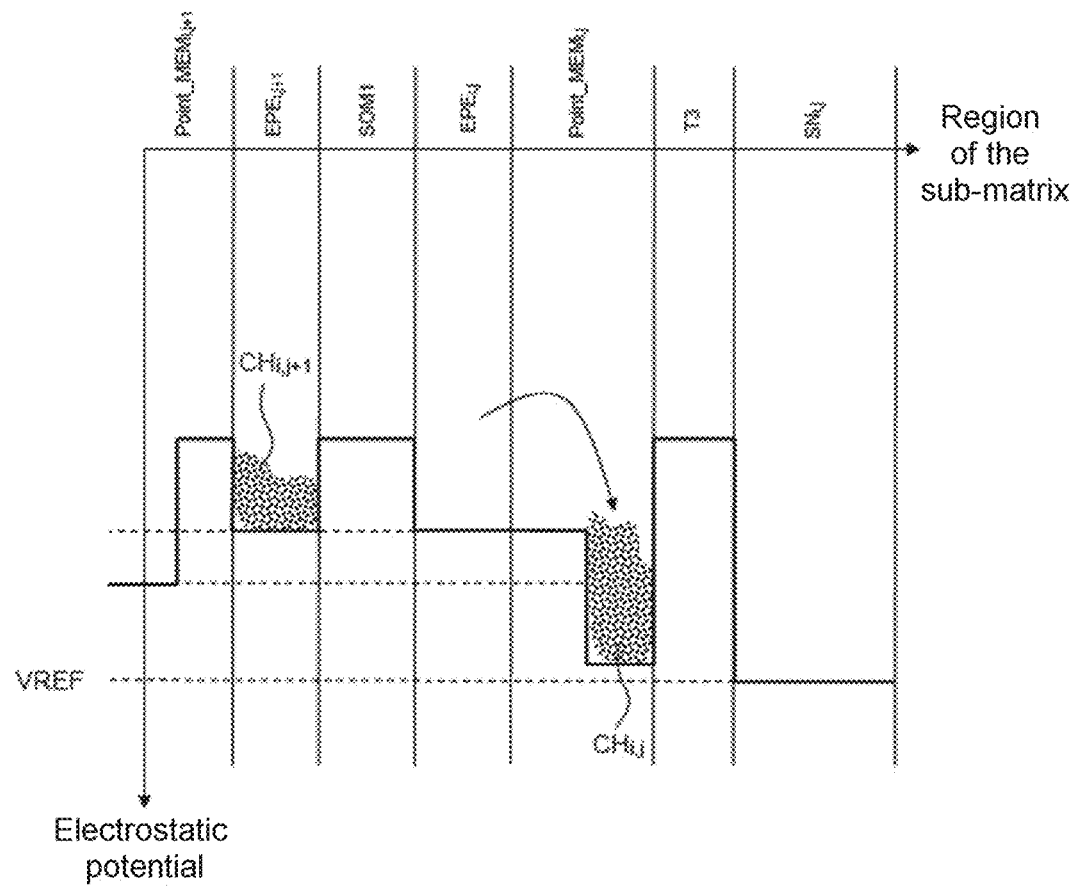
FIG. 6e shows a graph of electrostatic potentials illustrating the second step of the electric charge binning in a sub-matrix according to the first embodiment illustrated in FIG. 1.

FIGS. 6d and 6e show the movement of the electric charges from the pixels $Pxl_{i,j}$ and $Pxl_{i+1,j}$ of the receiver column $C_j$ to the memory points $POINT\_MEM_{i,j}$ and $POINT\_MEM_{i,j}$ following the rising edge tithe signal MEM1. The electrostatic potential graph of FIG. 6e shows this movement of the charges to the memory points in the pixels tithe column $C_j$ with MEM1=1 (high logic state) (lowering the potential barriers between the memory points and the photodiodes of $C_j$) and the trapping of the electric charges in the photodiodes of the pixels of the column $C_{j+1}$ with MEM2=0 (low logic state) (maintaining the potential barriers between the memory points and the photodiodes of $C_{j+1}$).

Figure 6F:
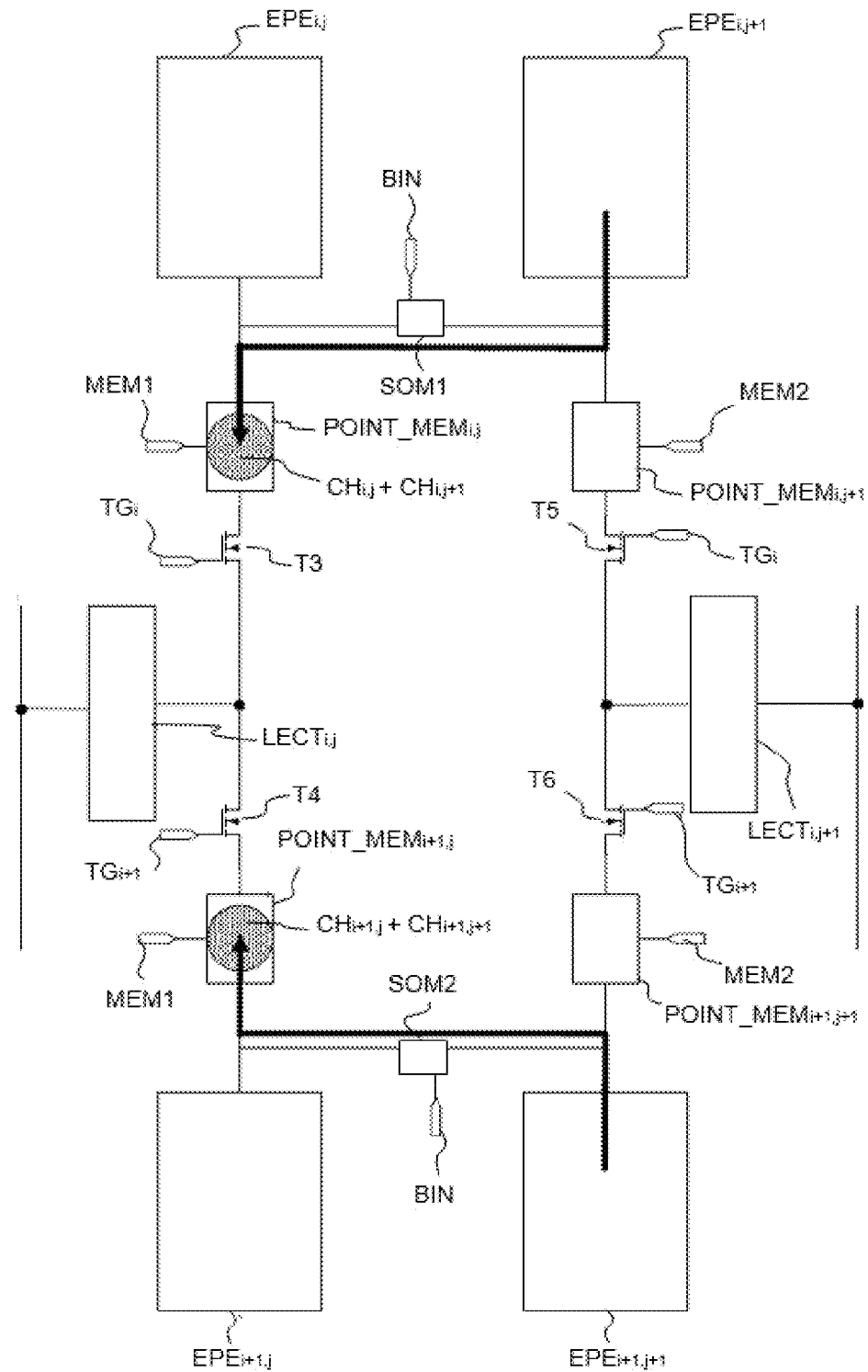
FIG. 6f shows the third step of the electric charge binning in a sub-matrix according to the first embodiment illustrated in FIG. 1.

The activation of the control signal BIN that controls the binning stages SOM1 and SOM2, and the keeping of MEM2 at a low potential level, trigger step PH3. The electric charges $CH_{i,j+1}$ and $CH_{i+1,j+1}$ that were generated and then trapped in the photodiodes of the pixels $Pxl_{i,j+1}$ and $Pxl_{i+1,j+1}$ pass through the binning stages SOM1 and SOM2, respectively. Since the control signal MEM1 is kept at a high potential (the inputs of $POINT\_MEM_{i,j}$ and $POINT\_MEM_{i+1,+j}$ are in the on state), the electric charges that pass through the binning stages coming from the column of rank j+1 $C_{j+1}$ are stored in turn in the memory points of the pixels of the column of rank j $C_j$, as illustrated in FIG. 6f. The binning in the direction of the rows is performed at the memory points $POINT\_MEM_{i,j}$ and $POINT\_MEM_{i,+1+j}$. This has the advantage of preserving the gain of the readout stage while limiting stray capacitances at the input of the readout stage.

The electrostatic potential graph 601 of FIG. 6g shows the migration of the electric charges from the photoelectric-effect element $EPE_{i,j+1}$ through the binning stage SOM1 so as, in an intermediate step, to access the photoelectric-effect element $EPE_{i,j}$ and then continue to the body of $POINT\_MEM_{i,j}$, as Illustrated in the graph 602 of FIG. 6g. By symmetry, the same arrangement of potential barriers is obtained in the substrate of the row of rank i+1, allowing the electric charges to migrate from the photodiode of the pixel $Pxl_{i,j+1}$ to the memory point of the pixel $Pxl_{i,j+1}$.

Thus, upon completion of the phase PH3, the horizontal binning in the sub-matrix S is performed for each row. The symmetry of the structure gives a person skilled in the art the possibility to perform horizontal binning in both directions by adjusting the sequence of control signals BIN, MEM1 and MEM2.

Figure 6H:
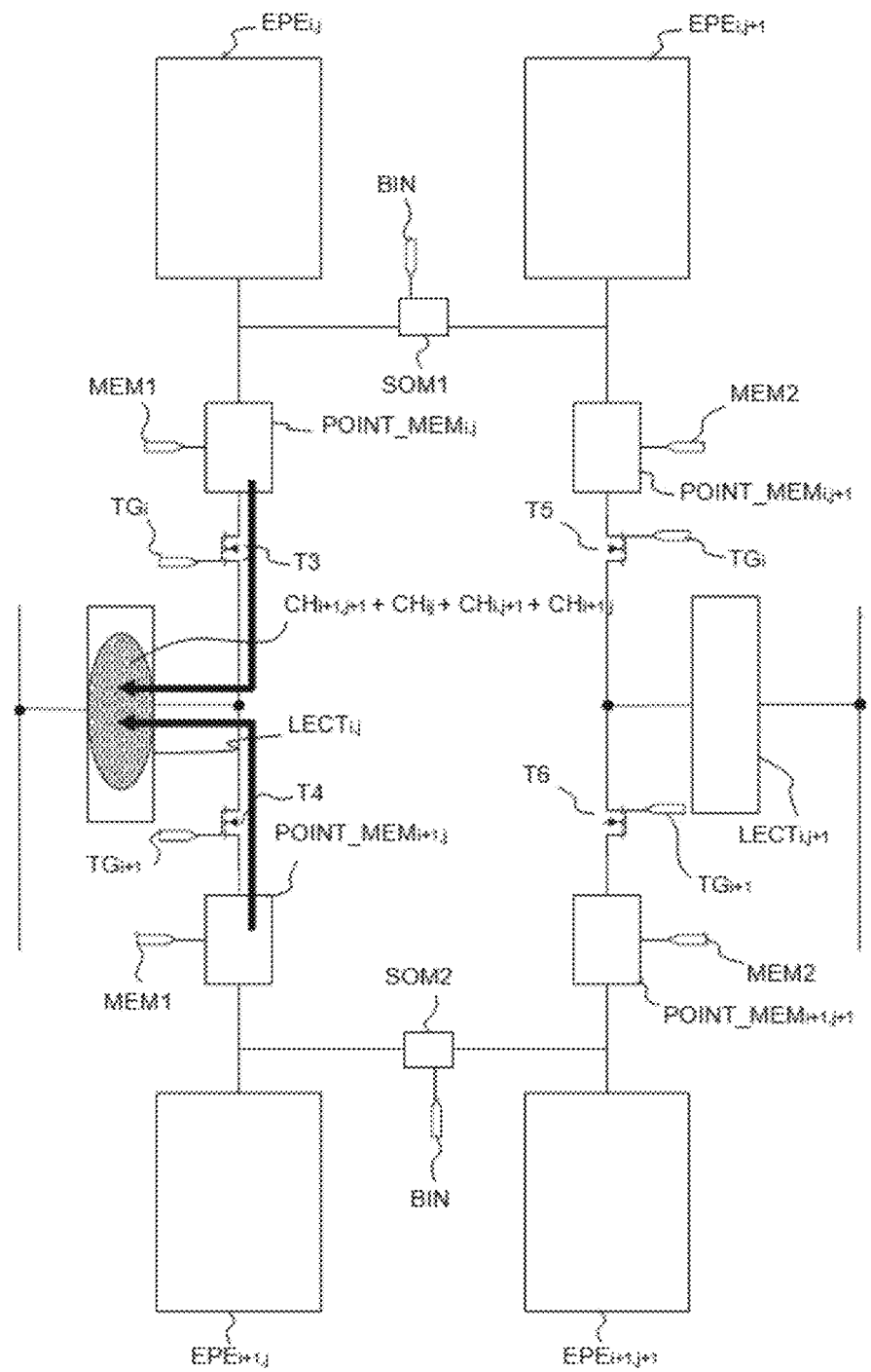
FIG. 6h shows the fourth step of the electric charge binning in a sub-matrix according to the first embodiment illustrated in FIG. 1.
Figure 6I:
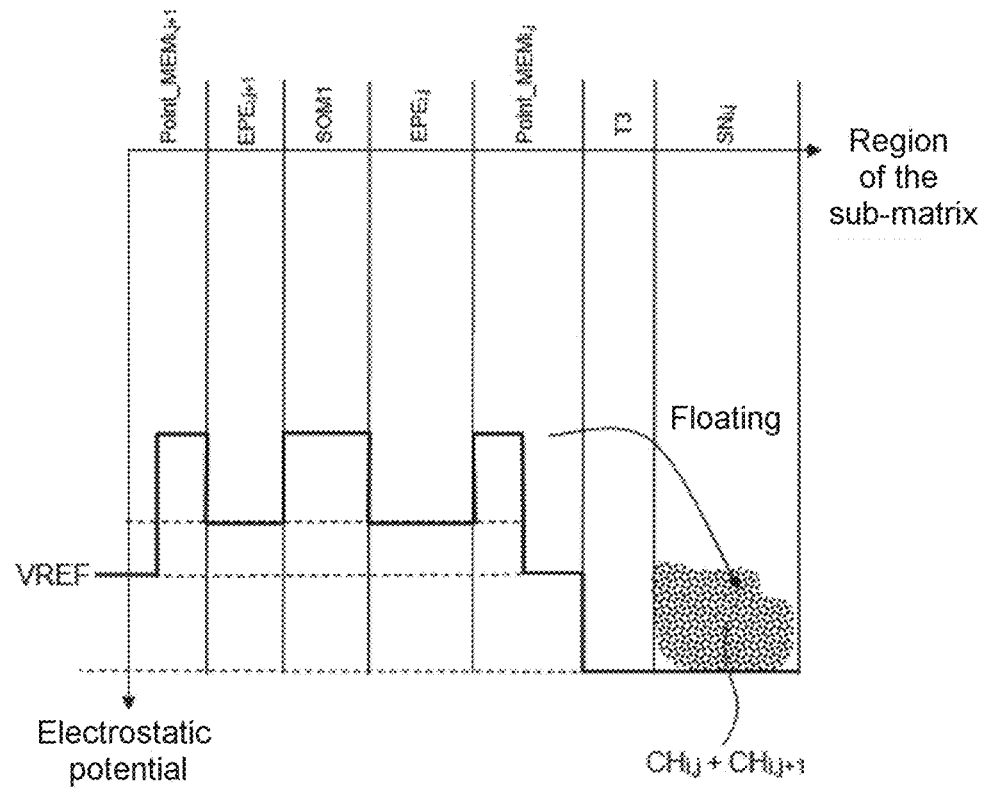
FIG. 6i shows a graph of electrostatic potentials illustrating the fourth step of the electric charge binning in a sub-matrix according to the first embodiment illustrated in FIG. 1.

The falling edge on the control signal MEM1 at t4 triggers the following horizontal binning and readout phase PH4. Since it is compatible with correlated double sampling, the reset value is sampled just before the falling edge of the reset signal $RST_i$. At t6, two simultaneous pulses (or consecutive pulses depending on the programming, as long as $RST_i$ is kept in a low logic state) on the two signals TG and $TG_{i+1}$ activate the two transfer gates T3 and T4 by lowering their potential barriers, as illustrated in FIGS. 6h and 6i. The charges stored beforehand in the memory points POINT_MEM$_{i,j}$ and POINT_MEM$_{i+1,j}$ are thus grouped together at the detection node SN$_{i,j}$. AN of the charges generated by the four pixels of the sub-matrix S are added together and accumulated in the same detection node SN$_{i,j}$ and converted into a voltage, and adapted by the readout stage LECT$_{i,j}$, and the payload signal is sampled so as to perform correlated double sampling subsequently at the system level in the image sensor.

The details of the process of the correlated double sampling are not described here to simplify the understanding of the process of binning the electric charges of the pixels of the sub-matrix (binning). A person skilled in the art has all the elements needed to implement the pixel electric charge binning according to the invention with this type of sampling.

Figure 7:
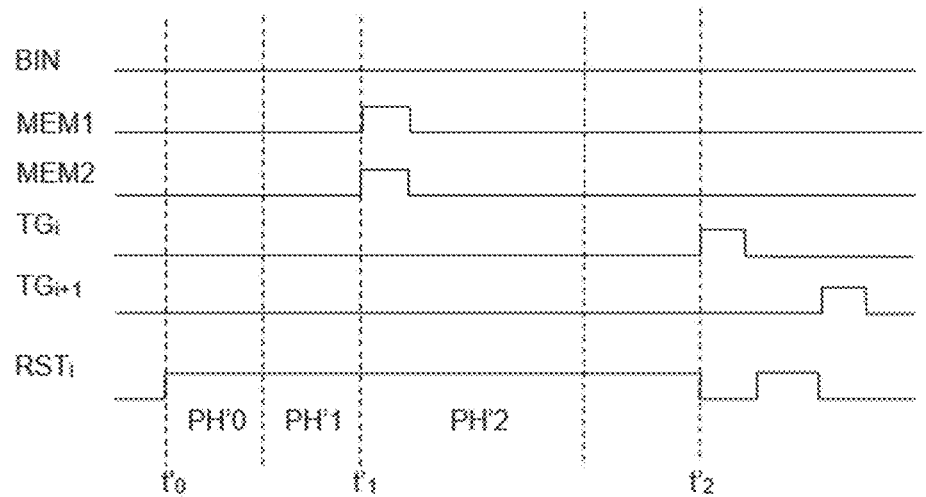
FIG. 7 shows a timing diagram of the operation of the sub-matrix illustrated in FIG. 1 for operation without electric charge binning.

FIG. 7 shows a timing diagram of the operation of the sub-matrix illustrated in FIG. 1 without electric charge binning.

The reset and integration phases PH'0 and PH'1 are identical to the timing diagram of FIG. 6a.

At t'1, the two pulses on the control signals MEM1 and MEM2 open up access to all of the memory points belonging to the pixels that form the sub-matrix S. The charges generated by each of the photodiodes thus migrate to the associated memory points, thus performing the phase PH'2 of storing the electric charges in global shutter operation. The signal BIN is kept in a low logic state so as to retain the potential barrier between two adjacent photoelectric elements belonging to the same row.

From t'2, the two consecutive pulses on the control signals TG$_i$ and TG$_{i+1}$ make it possible to successively activate the transfer gates T3, T4, T5 and T6 and thus to accumulate the charges of the pixel Pxl$_{i,j}$ on the detection node SN$_{i,j}$ and of Pxl$_{i,j+1}$ on the detection node SN$_{i,j+1}$ (so as to be propagated to the readout stages LECT$_{i,j}$ and LECT$_{i,j+1}$, respectively), and then, second of all, to accumulate the charges of the pixel Pxl$_{i+1,j}$ on the detection node SN$_{i,j}$ and of Pxl$_{i+1,j+1}$ on the detection node SN$_{i,j+1}$ (so as to be propagated to the readout stages LECT$_{i,j}$ and LECT$_{i,j+1}$, respectively).

This thus gives global shutter operation without binning within the pixels that form the sub-matrix S.

One advantage of the invention is that the proposed implementation allows operation with or without charge binning.

Figure 8:
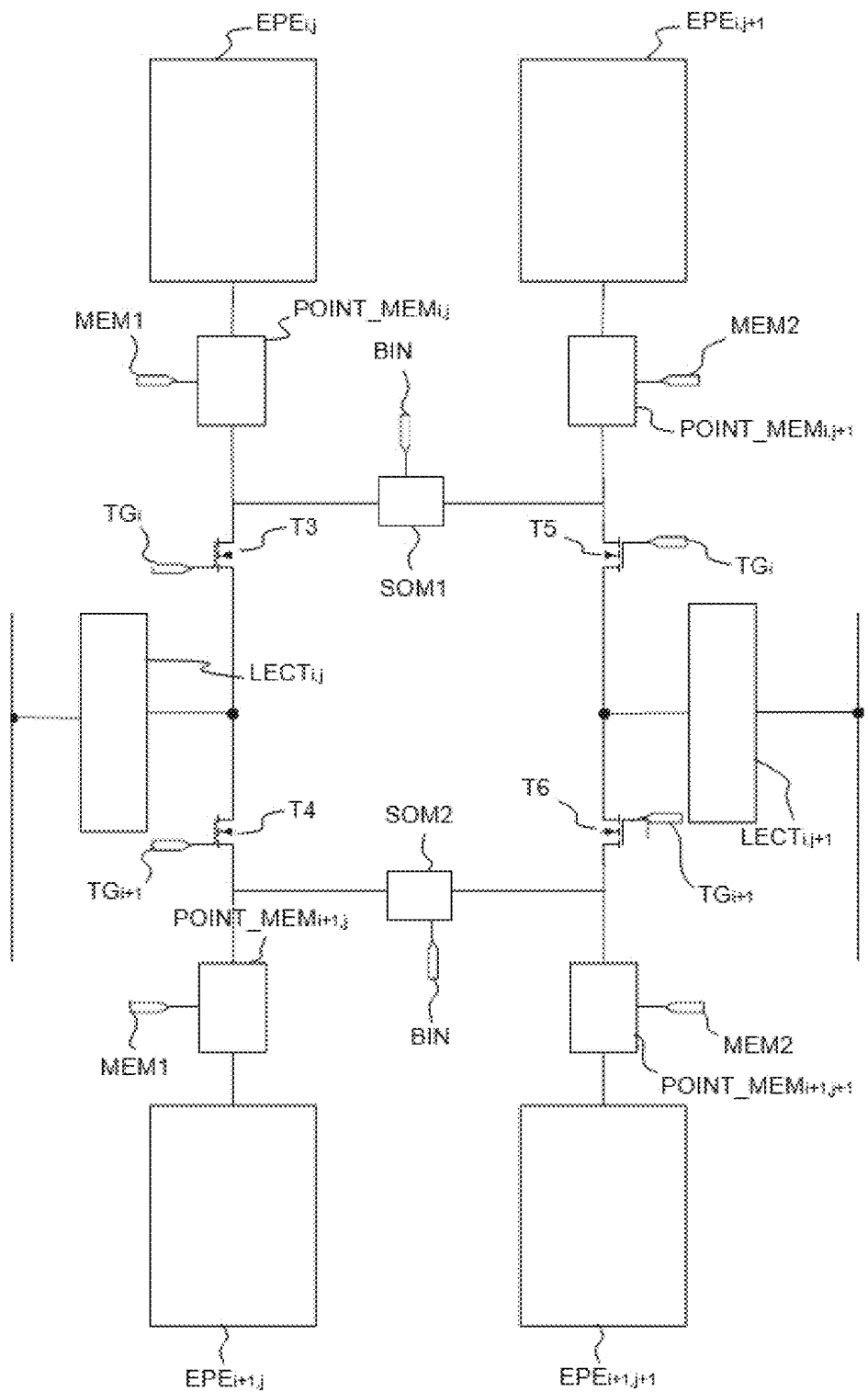
FIG. 8 shows a functional diagram of a pixel sub-matrix according to a second embodiment of the invention.

FIG. 8 shows a functional diagram of a pixel sub-matrix according to a second embodiment of the invention.

The second embodiment of the sub-matrix S differs from the first embodiment through the connection of the binning stage SOM1 between the outputs of the memory points POINT_MEM$_{i,j}$ and POINT_MEM$_{i,j+1}$ belonging to the row of rank i L$_i$ of the sub-matrix S and the connection of the binning stage SOM2 between the outputs of the memory points POINT_MEM$_{i+1,j}$ and POINT_MEM$_{i+1,j+1}$ belonging to the row of rank i+1 L$_{i+1}$ of the sub-matrix S.

The second embodiment described in FIG. 8 has the technical advantage of the possibility of inverting the rows and the columns when it is implemented. It also makes it possible to increase the number of charges able to be stored in the memory points POINT_MEM$_{i,j}$ and POINT_MEM$_{i,j+1}$ belonging to the same row, since they will be isolated from one another by the binning stage SOM1. (the same applies for the memory points POINT_MEM$_{i,j}$ and POINT_MEM$_{i,j+1}$).

Figure 9A:
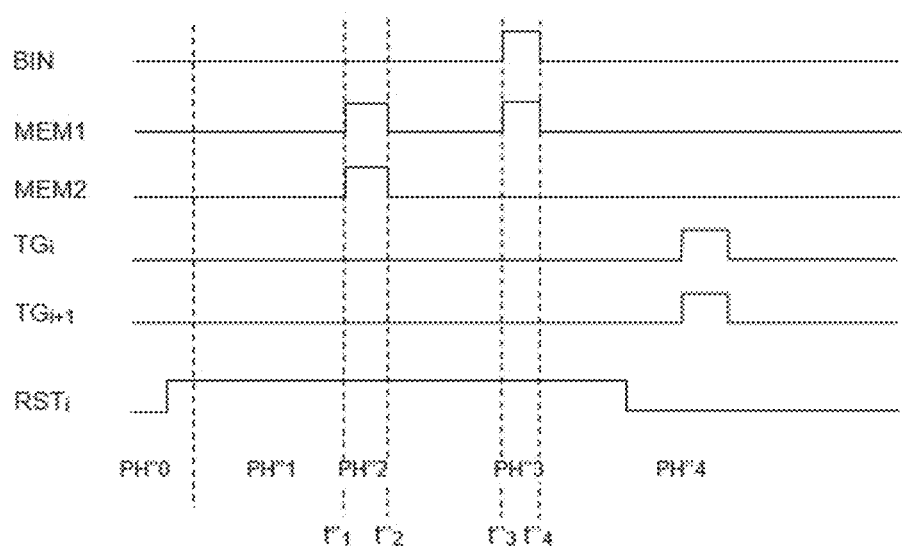
FIG. 9a shows a timing diagram of the operation of the sub-matrix illustrated in FIG. 8 during electric charge binning.

FIG. 9a shows a timing diagram of the operation of the sub-matrix illustrated in FIG. 8 with electric charge binning according to the second embodiment of the invention.

FIGS. 9b to 9e illustrate the path of the electric charges during the various binning steps in the sub-matrix S according to the second embodiment.

The reset and integration phases PH"0 and PH"1 are identical to those in the timing diagram of FIG. 8a (specifically PH0 and PH1).

Figure 9B:
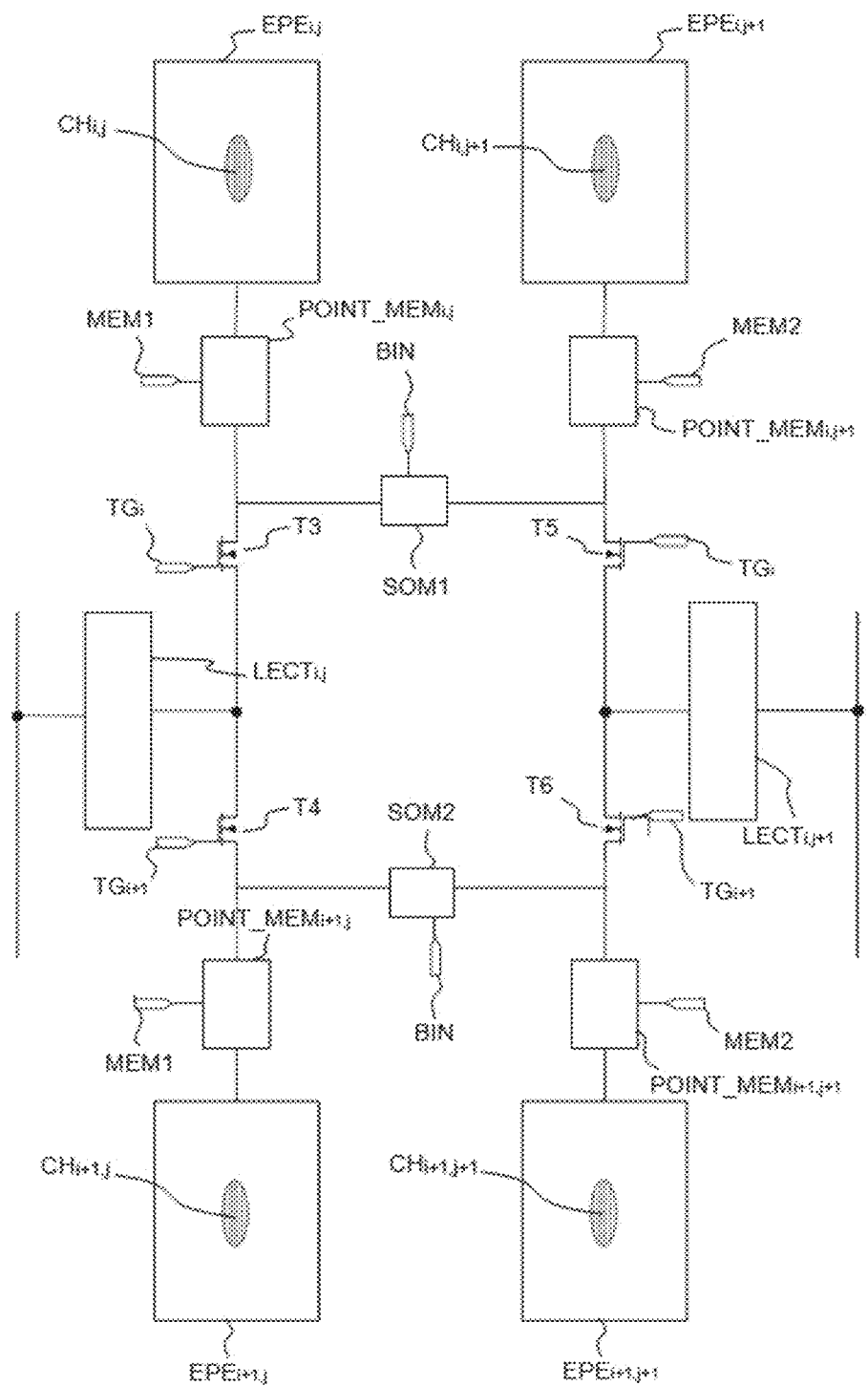
FIG. 9b shows the first step of operation with electric charge binning in a sub-matrix according to the second embodiment illustrated in FIG. 8.
Figure 9C:
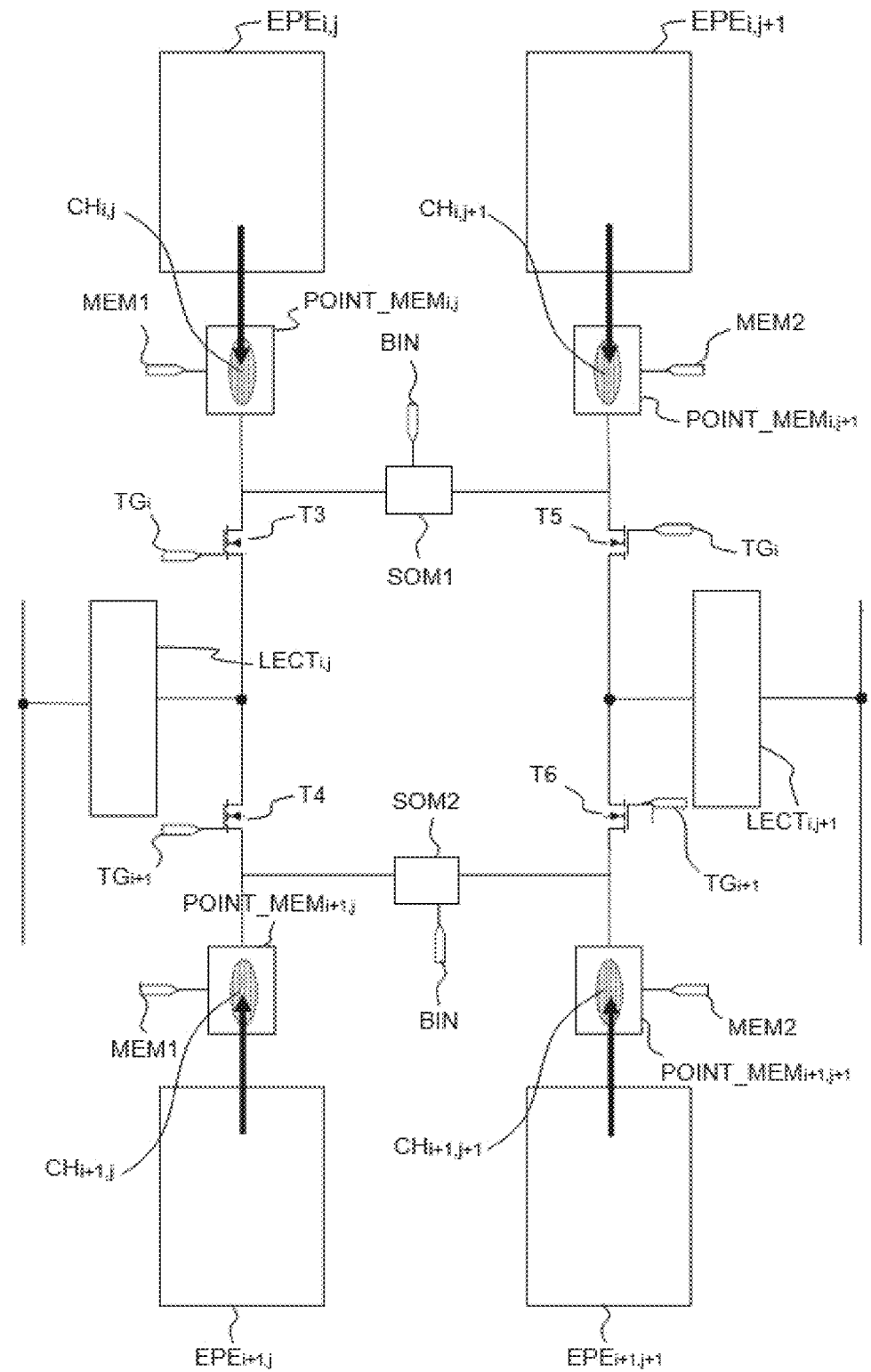
FIG. 9c shows the second step of operation with electric charge binning in a sub-matrix according to the second embodiment illustrated in FIG. 8.

Following the charge integration by the photodiodes of the pixels of the sub-matrix S, as illustrated in FIG. 9b, and at the time t"1, the two pulses on the signals MEM1 and MEM2 open up the potential banners at the inputs of the memory points of all of the pixels of the sub-matrix S. The charges are thus stored in the various memory points as shown in FIG. 9c, and step PH"2 is finished with the falling edges on the signals MEM1 and MEM2 at t"2.

Figure 9D:
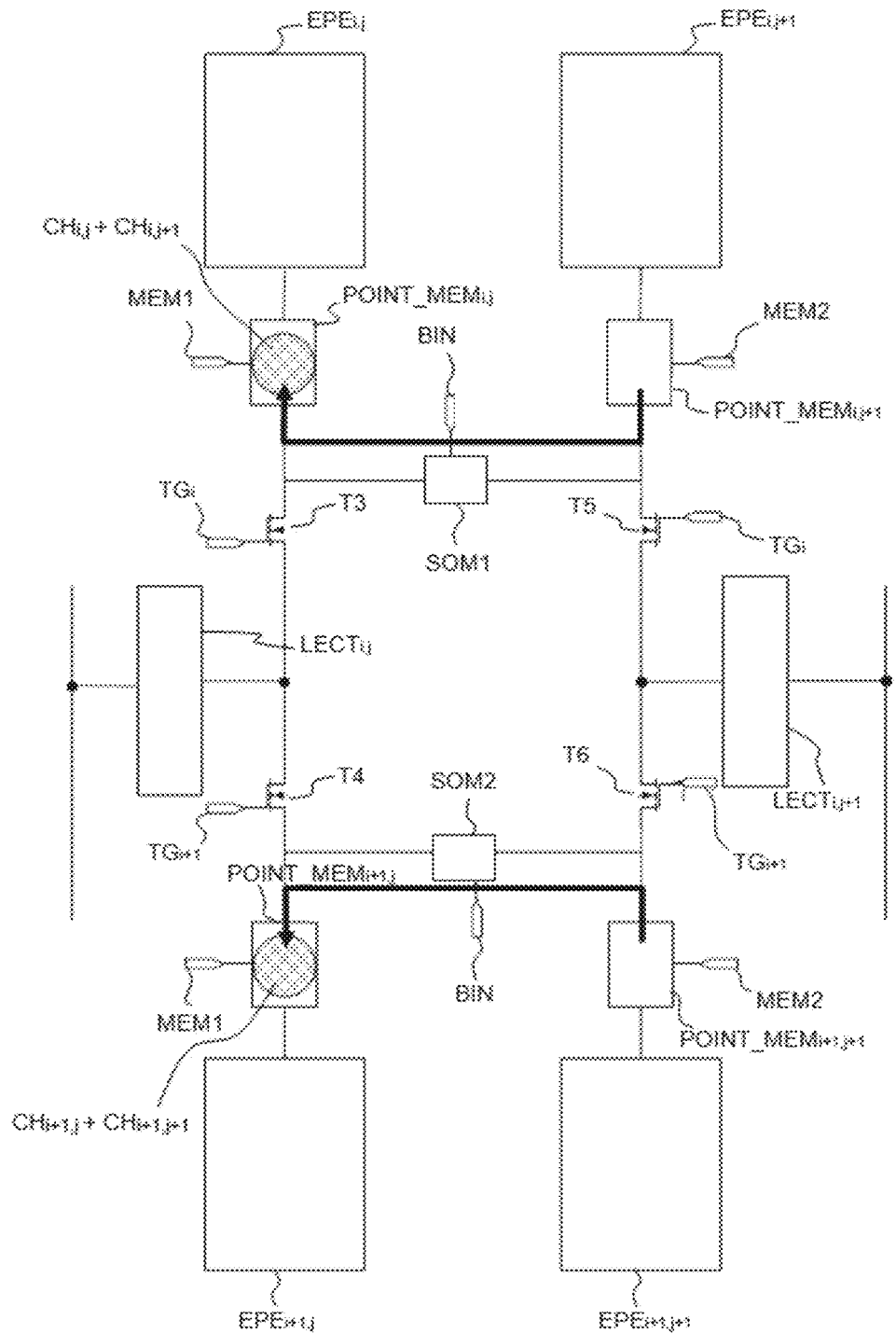
FIG. 9d shows the third step of operation with electric charge binning in a sub-matrix according to the second embodiment illustrated in FIG. 8.

At t"3, the horizontal binning phase PH"3 is triggered with the two simultaneous pulses on the signals BIN and MEM1, allowing the charges stored in the memory points POINT_MEM$_{i,j+1}$ and POINT_MEM$_{i+1,j+1}$ to migrate to the memory points POINT_MEM$_{i,j}$ and POINT_MEM$_{i+1,j}$, respectively, based on the same physical mechanism described above. The horizontal binning is thus performed after the phase PH"3, as shown in FIG. 9d.

Figure 9E:
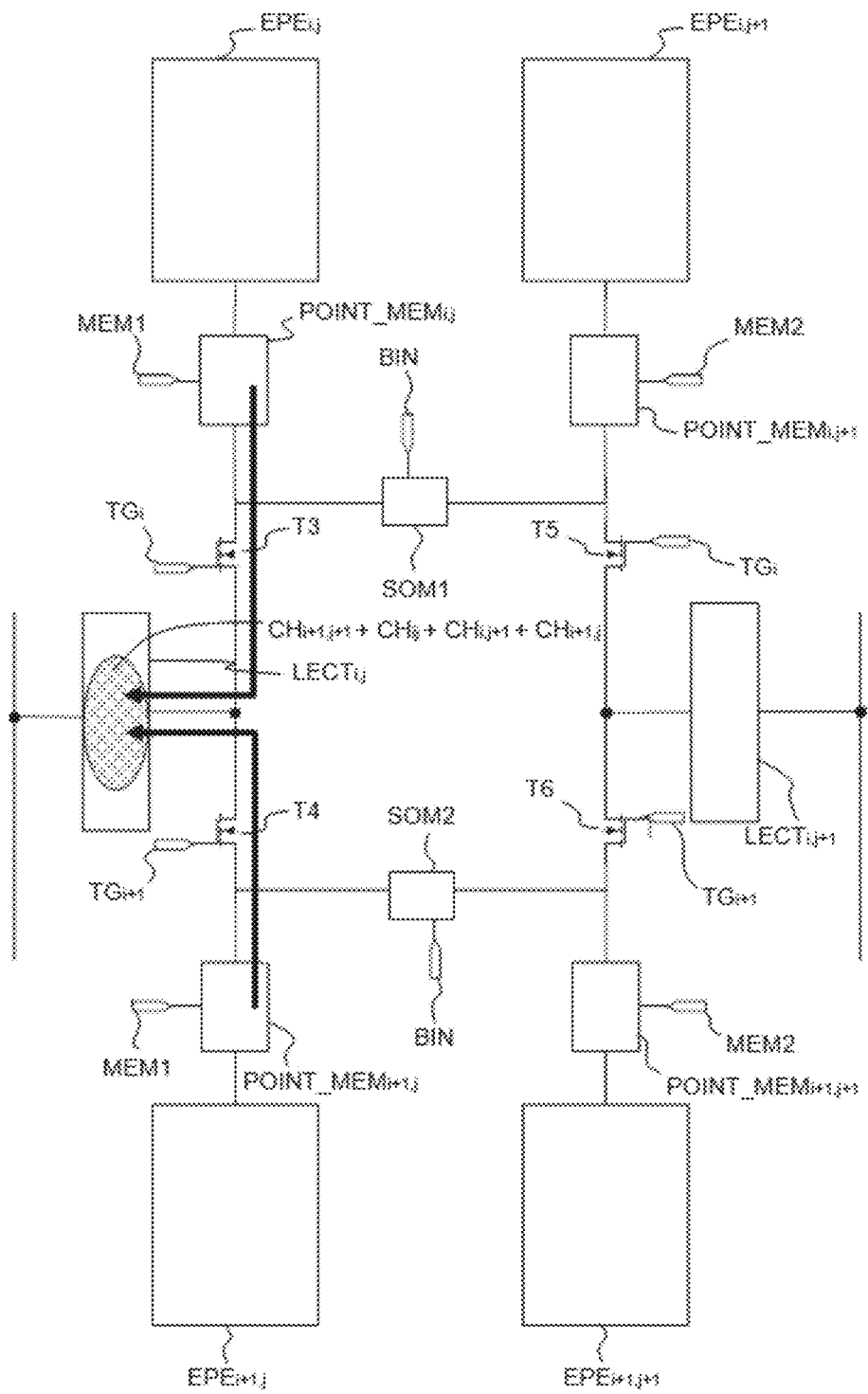
FIG. 9e shows the fourth step of operation with electric charge binning in a sub-matrix according to the second embodiment illustrated in FIG. 8.

At t"4, the last readout and vertical binning phase PH"4 is identical to the phase PH4 described in the binning operation for the first embodiment. The result of this phase is illustrated in FIG. 9e.

Figure 10:
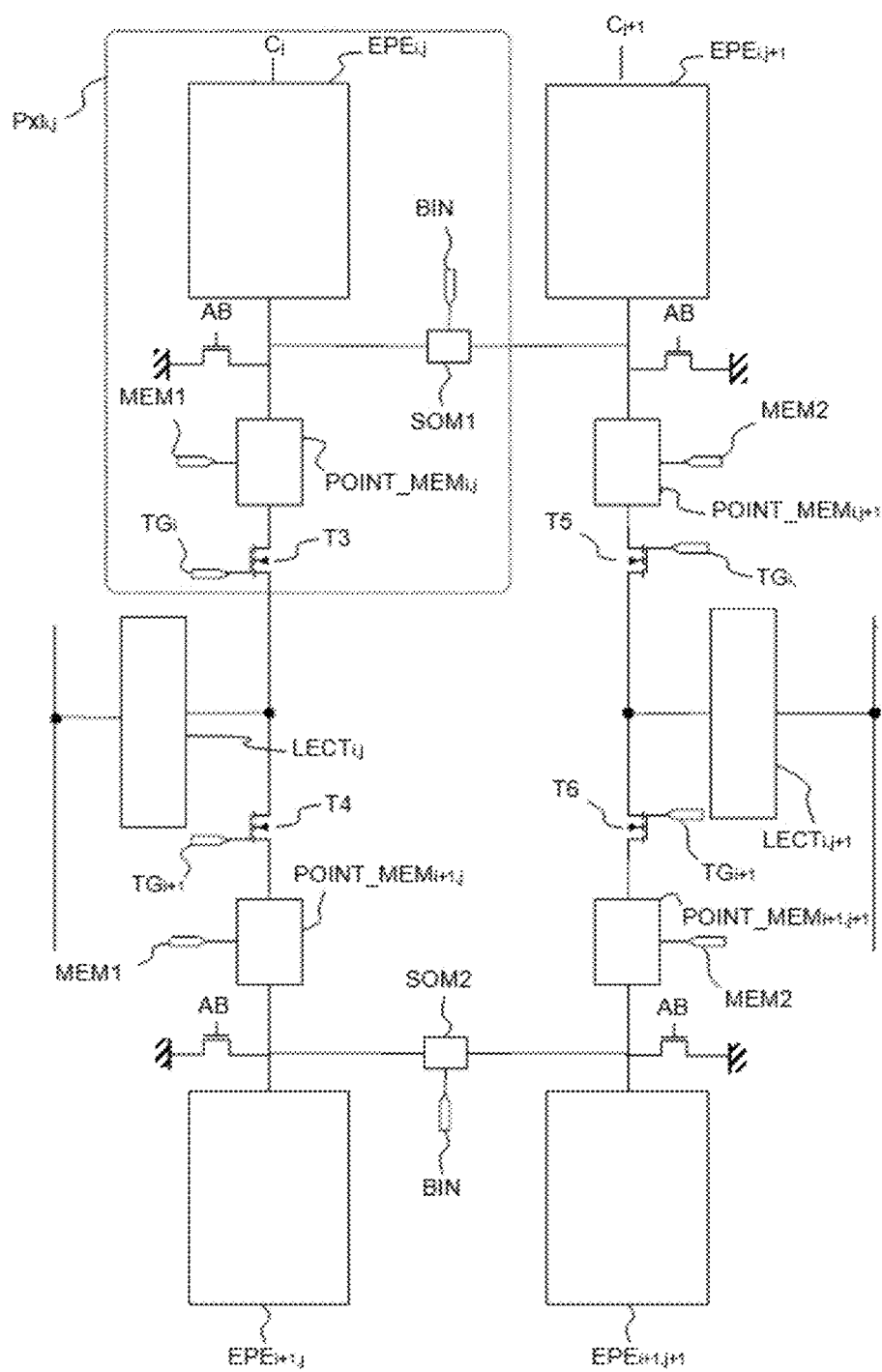
FIG. 10 shows a functional diagram of a pixel sub-matrix according to a third embodiment of the invention.

FIG. 10 shows a third embodiment of a pixel sub-matrix according to the invention. Each of the pixels additionally integrates an anti-glare transistor 77 controlled by an input signal AB and connected to the photoelectric-effect element belonging to the same pixel. The control signal AB is common to all of the anti-glare transistors of the pixels of the sub-matrix S. This transistor makes it possible to reset the photodiode to zero without passing via the detection nodes SN$_{i,j}$ and SN$_{i,j+1}$. It also makes it possible to trigger the integration of the following image before the end of the readout of the current image. Reference is made here to "Integration while read" (IWR).

Figure 11:
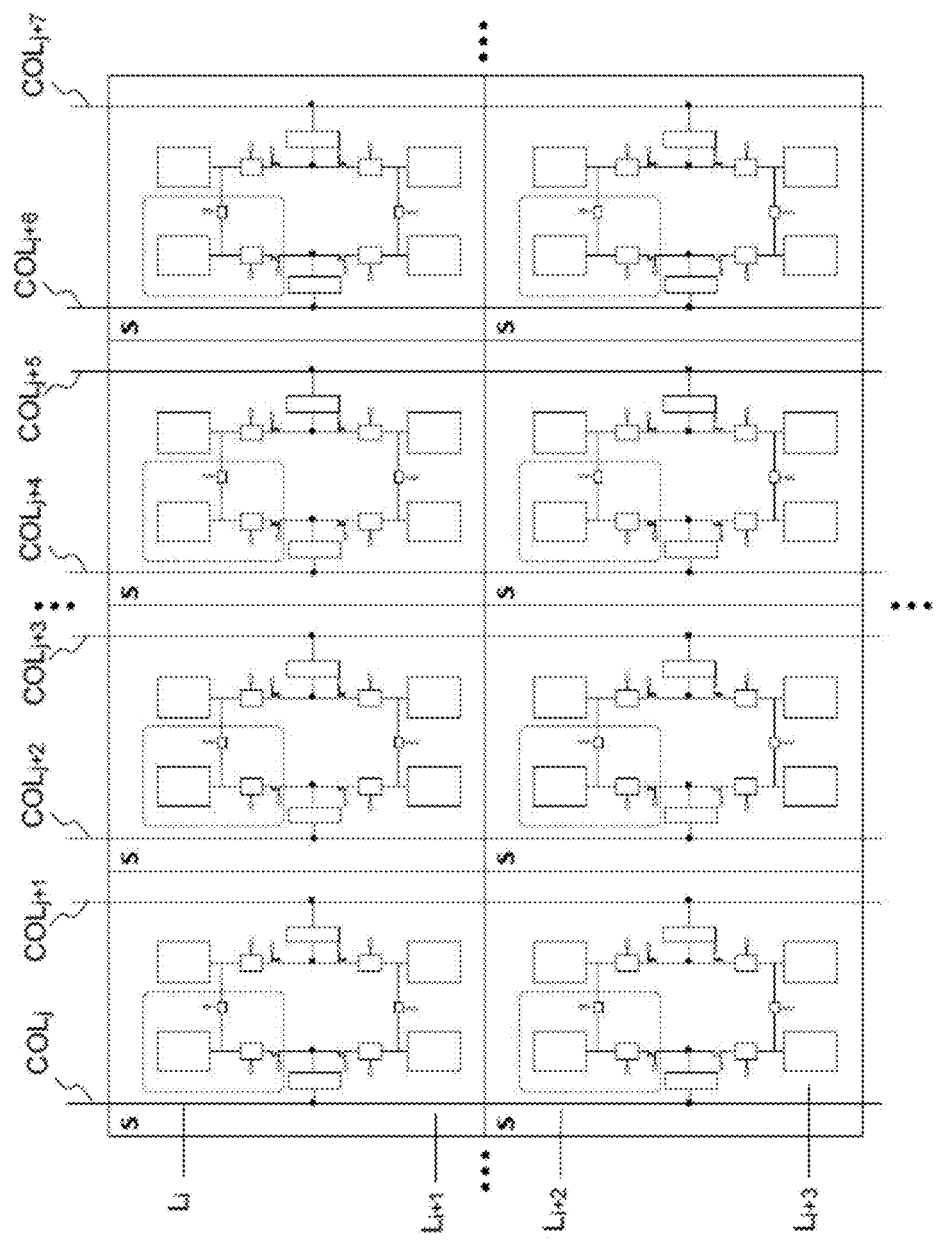
FIG. 11 shows one exemplary implementation of a pixel matrix containing pixel sub-matrices according to the first embodiment of the invention illustrated in FIG. 1.

FIG. 11 illustrates one exemplary implementation of the sub-matrices S according to the first embodiment of the invention for obtaining a pixel matrix MP capable of performing binning of 2*2 pixels so as to have virtual macro-pixels of the same size, and with a square shape factor. The abutment of the sub-matrices S belonging to one and the same column makes it possible to connect the conductive rows (COL$_{i,j}$, COL$_{i,j+1}$, etc.) retrieving the signals at the outputs of the readout stages (LECT$_{i,j}$, LECT$_{i+1,j}$, etc.) for any value of j from 1 to M so as to form a main conductive row COL$_j$. The pixel matrix MP is obtained by repeating the abutment operation over both spatial dimensions.

Figure 12:
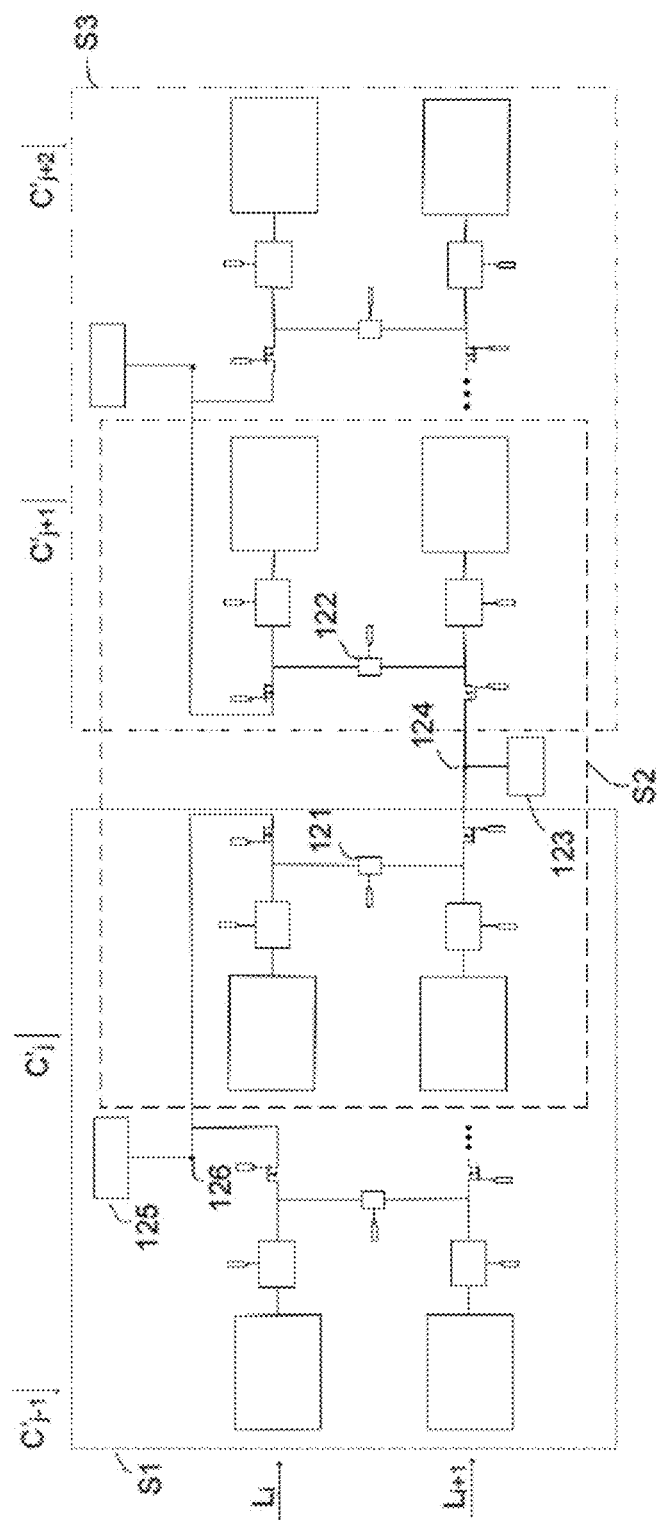
FIG. 12 shows one exemplary implementation of a pixel matrix containing pixel sub-matrices according to one variant of the second embodiment of the invention illustrated in FIG. 8.

FIG. 12 shows one exemplary implementation of a pixel matrix containing pixel sub-matrices according to one variant of the second embodiment of the invention illustrated in FIG. 8.

The sub-matrices do not abut one another, but they share common parts with one another, as may be observed in the sub-matrices S1 and S2 of FIG. 12. The sub-matrix S1 consists of pixels of the column C'$_{j-1}$ and C'$_j$. The sub-matrix S2 consists of pixels of the column C'$_j$ and C'$_{j+1}$. The sub-matrix S3 consists of pixels of the column C'$_{j+1}$ and C'$_{j+2}$.

If taking the example of the sub-matrix S1, the binning stages 121 and 122 connect the pixels belonging to one and the same column, and not one and the same row, as has been described in FIG. 8. In addition, the sub-matrix S2 comprises a single readout stage 123 connected to the common detection node 124 of the two pixels belonging to the row of rank i+1 $L_{i+1}$ of the sub-matrix S2. On the other hand, the adjacent sub-matrix S1 comprises a single readout stage 125 connected to the detection node 126 common to the two pixels of the row of rank i $L_{i+1}$ belonging to the sub-matrix S1. The same arrangement is obtained for the sub-matrix S3, creating an alternating symmetrical structure between the adjacent sub-matrices S1, S2 and S3.

It should be emphasized that this embodiment does not allow binning in both directions between the rows within one and the same pixel sub-matrix, but it has the advantage of obtaining a more compact implementation in comparison with the other embodiments.

Figure 13:
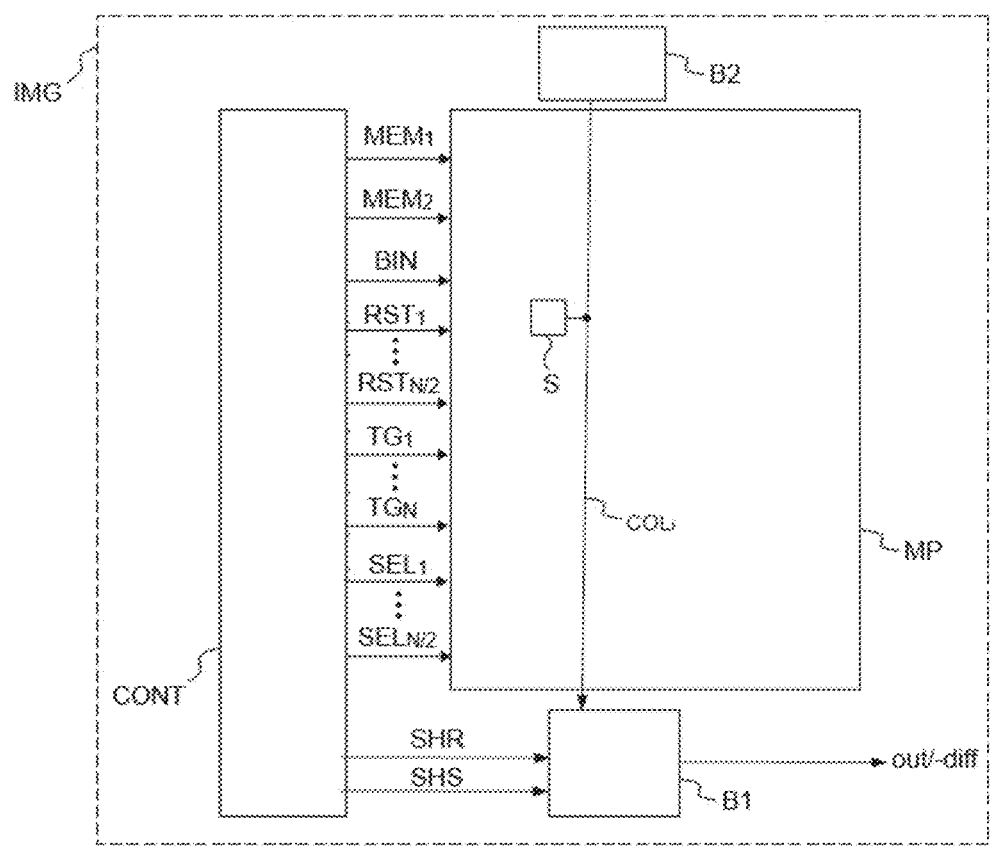
FIG. 13 shows a functional diagram of an image sensor integrating a pixel matrix according to any one of the embodiments of the invention.

FIG. 13 shows a functional diagram of an image sensor IMG integrating a pixel matrix according to one of the embodiments of the invention. The active-pixel image sensor described in FIG. 13 comprises the following elements.

An active-pixel matrix MP contains at least one sub-matrix S formed according to the invention. The matrix consists of rows and columns of pixels. In FIG. 13, a single sub-matrix S has been shown in the matrix to simplify the depiction.

The image sensor IMG also comprises a control signal generation circuit CONT for generating control signals for the pixels. This circuit is used to control the various operating phases of the active pixels of the matrix MP by generating, for each pixel, the signals $SEL_i$ with i from 1 to N/2, for the readout phase, $TG_i$ with i from 1 to N, for the charge transfer phase and $RST_i$, with i from 1 to N/2, for the resetting of the detection nodes. The control circuit CONT also generates the signals MEM1, MEM2 and BIN, which manage the horizontal and vertical binning phases. This block additionally generates two other control signals, specifically SHR and SHS, which control the sampling phase.

The image sensor also comprises a sampling circuit B1 arranged at the base of each column of the pixel matrix and connected to the output of the readout stage of each pixel of the corresponding column. A correlated double sampling circuit B1 may be used to implement this function. This correlated double sampling solution makes it possible to read out the signals while at the same time eliminating kTC noise generated in the pixels of the column in question. First of all, the output signal from the pixel sampled following a reset is stored. The stored sample corresponds to the reset signal. Second of all, the signal sampled after exposure of the pixel to light is stored. The stored sample corresponds to the payload signal. A subtraction between the two sampled signals makes it possible to eliminate kTC noise. The result of this differential measurement out_diff is transmitted to an analogue-to-digital converter, not shown in FIG. 13 for the sake of simplification. It should be noted that the samples are always read out row by row in the case of a global or rolling shutter.

The image sensor also comprises a power supply circuit B2 for supplying power to each column of the pixel matrix. In FIG. 13, this is a current source connected to the conductor of the column. This current source, common to all of the pixels of a column, is used to bias the transistors of the amplification stage during readout of the pixel.

Other variants of the image sensor including an active-pixel matrix according to the invention may easily be conceived by a person sidled in the art.

The described invention makes it possible to implement a CMOS image sensor whose matrix array is formed via 2*2 sub-matrices allowing the implementation of the pixel binning functionality in the charge domain. This feature makes it possible to improve the sensitivity of the image sensor under conditions of low brightness, but also to reduce channel noise in the pixel matrix. This then makes it possible to increase the signal-to-noise ratio of the image sensor.

The solution described by the invention thus differs from the prior art at least through the performance of pixel binning in the charge domain while still remaining compatible with global shutter operation. In addition, the invention has the advantage of reducing the capacitance of the detection node in comparison with the technique of sharing four pooled output nodes used by the implementations from the prior art. The image sensor according to the invention still leaves the possibility of operating without electric charge binning, thereby giving a person skilled in the art flexibility to adapt the operation of the sensors depending on the conditions of the image capture environment by modifying the sequence of control signals that govern the activation of the analogue pixel binning.

The invention claimed is:

1. A pixel matrix of N rows and M columns produced in a semiconductor substrate, the matrix comprising at least one sub-matrix of four adjacent pixels,
   each of the pixels of the sub-matrix comprising:
   a set of a photoelectric-effect element for generating electric charges in response to incident electromagnetic radiation and a memory point connected to an output of the photoelectric-effect element for storing the generated electric charges,
   a detection node,
   a transfer gate, connected between the output of the memory point and the detection node,
   a binning stage,
   the binning stage being connected to said set and being common with an adjacent pixel of the sub-matrix belonging to the same row of said pixel,
   at least one detection node per sub-matrix being common to two adjacent pixels of the sub-matrix belonging to the same column,
   the pixel matrix furthermore comprising at least one readout stage per sub-matrix, connected to a common detection node.

2. The pixel matrix according to claim 1, wherein each of the photoelectric-effect elements is a pinned photodiode.

3. The pixel matrix according to claim 1, wherein each of the binning stages is formed by a pair of deep isolation trenches arranged in parallel.

4. The pixel matrix according to claim 1, wherein each of the memory points is formed by an arrangement of deep isolation trenches, the deep isolation trenches forming two electric charge traps, a first trap constituting an input of the memory point and a second trap, doped with charge carriers at a dose greater than that of the first trap, constituting a body of the memory point.

5. The pixel matrix according to claim 1, wherein each of the memory points is formed by an arrangement of two pairs of deep isolation trenches, the deep isolation trenches forming two electric charge traps, a first trap constituting an input of the memory point being formed by a first pair of trenches arranged in parallel and separated by a first distance, and a second trap constituting a body of the memory point being formed by a second pair of trenches arranged in parallel and separated by a second distance; and
   wherein the first distance being smaller than the second distance.

6. The pixel matrix according to claim 4, wherein:
the binning stage is connected between the output of the photoelectric-effect element and the output of the photoelectric-effect element of the adjacent pixel of the sub-matrix belonging to the same row,
the pixels of the sub-matrix belonging to the same column have a common detection node and a common readout stage.

7. The pixel matrix according to claim 6, comprising control means configured so as to apply, for each pixel of one and the same column:
a high potential to the deep isolation trenches forming the memory point for receiving the electric charges generated by the photoelectric-effect element;
a low potential to the deep isolation trenches forming the memory point belonging to the adjacent pixel of the sub-matrix belonging to the same row; and
a low potential to the deep isolation trenches forming the binning stage.

8. The pixel matrix according to claim 7, wherein the control means are configured so as to apply, simultaneously for each pixel of one and the same column:
a high potential to the deep isolation trenches forming the memory point;
a low potential to the deep isolation trenches forming the memory point belonging to the adjacent pixel of the sub-matrix belonging to the same row; and
a high potential to the deep isolation trenches forming the binning stage, in order to bin the electric charges generated by the pixels belonging to one and the same row of the sub-matrix.

9. The pixel matrix according to claim 4, wherein
the binning stage of a pixel of the sub-matrix is connected between the output of the memory point and the output of the memory point of the pixel of the sub-matrix belonging to the same row; and
the pixels of the sub-matrix belonging to the same column have a common detection node and a common readout stage.

10. The pixel matrix according to claim 4, wherein the binning stage of a pixel of the sub-matrix is connected between the output of the memory point and the output of the memory point of the pixel of the sub-matrix belonging to the same column, a first pair of pixels of the sub-matrix belonging to the same row share a common detection node and a common readout stage,
a second pair of pixels of a sub-matrix belonging to the same column are shared with an adjacent sub-matrix,
the first pair of pixels of the adjacent sub-matrix being arranged on a different row from the first pair of pixels of the sub-matrix.

11. The pixel matrix according to claim 9,
wherein control means are configured so as to apply, for each pixel of the sub-matrix a high potential to the deep isolation trenches forming the memory point for receiving the electric charges generated by the photoelectric-effect elements; and
wherein a low potential to the deep isolation trenches forming the binning stages.

12. The pixel matrix according to claim 11, wherein the control means are configured so as to simultaneously apply, to a pair of adjacent pixels in a first direction a high potential to the deep isolation trenches forming the memory point;
a low potential to the deep isolation trenches forming the memory point belonging to the adjacent pixel of the sub-matrix in a second direction different from the first direction;
a high potential to the deep isolation trenches forming the binning stages;
in order to bin the electric charges generated by the adjacent pixels in the second direction.

13. The pixel matrix according to claim 8, wherein the control means are configured so as to apply, to a pair of adjacent pixels in a first direction, for example to two pixels of the same column, and
a high potential to the transfer gates in order to bin the electric charges generated in the common readout stage.

14. The pixel matrix according to claim 1, wherein each readout stage comprises:
a reset transistor connected to the detection node in order to reset the detection node to a chosen supply voltage;
an amplification transistor connected in a common drain configuration, whose gate is connected to the detection node; and
a selection transistor connected to the output of the amplifier transistor in order to sample an output signal.

15. An image sensor comprising:
a pixel matrix according to claim 1,
a control signal generation circuit for generating control signals for the pixels,
a sampling circuit arranged at a base of each column of the pixel matrix, connected to the output of the readout stage of each pixel of the corresponding column, and
a power supply circuit for supplying power to each column of the pixel matrix.

16. The image sensor according to claim 15, wherein the sampling circuit is a correlated double sampling circuit.

17. The image sensor according to claim 15, the sensor being designed for global shutter operation.

* * * * *